(12) United States Patent
Bretl et al.

(10) Patent No.: US 6,765,508 B2
(45) Date of Patent: Jul. 20, 2004

(54) ROBUST SYSTEM FOR TRANSMITTING AND RECEIVING MAP DATA

(75) Inventors: Wayne E. Bretl, Grayslake, IL (US); Timothy G. Laud, Libertyville, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 0 days.

(21) Appl. No.: 10/674,191

(22) Filed: Sep. 29, 2003

(65) Prior Publication Data

US 2004/0104828 A1 Jun. 3, 2004

Related U.S. Application Data

(63) Continuation-in-part of application No. 10/663,953, filed on Sep. 16, 2003, which is a continuation-in-part of application No. 10/368,737, filed on Feb. 18, 2003, which is a continuation-in-part of application No. 10/345,609, filed on Jan. 16, 2003, now abandoned, which is a continuation-in-part of application No. 10/282,394, filed on Oct. 29, 2002, which is a continuation-in-part of application No. 10/011,333, filed on Dec. 3, 2001, now Pat. No. 6,563,436.

(60) Provisional application No. 60/324,096, filed on Sep. 22, 2001.

(51) Int. Cl.[7] ............................................... H03M 7/00
(52) U.S. Cl. .......................................... 341/50; 341/51
(58) Field of Search ............................... 341/50, 51, 67

(56) References Cited

U.S. PATENT DOCUMENTS 6,563,436 B2 * 5/2003 Fimoff et al. .................. 341/50

* cited by examiner

*Primary Examiner*—Brian Young
*Assistant Examiner*—Joseph Lauture

(57) ABSTRACT

A field contains a map, a number of E-VSB data segments, and a number of VSB data segments. The map indicates at least the number of E-VSB data segments in the field. The E-VSB data segments are located in the field such that the spacing between the E-VSB segments comprises only x and x+1, where x is dependent on the number of E-VSB data segments in the field as indicated by the map.

16 Claims, 12 Drawing Sheets

|  | 1/4 Rate → | | | | | | | | | | | | |
|---|---|---|---|---|---|---|---|---|---|---|---|---|---|
|  |  | 0 | 4 | 8 | 12 | 16 | 20 | 24 ... | 292 | 296 | 300 | 304 | 308 | 312 |
| 1/2 Rate ↓ | 0 | 0 | 4 | 8 | 12 | 16 | 20 | 24 | 292 | 296 | 300 | 304 | 308 | 312 |
| | 2 | 2 | 6 | 10 | 14 | 18 | 22 | 26 | 294 | 298 | 302 | 306 | 310 | 314 |
| | 4 | 4 | 8 | 12 | 16 | 20 | 24 | 28 | 296 | 300 | 304 | 308 | 312 | 316 |
| | 6 | 6 | 10 | 14 | 18 | 22 | 26 | 30 | 298 | 302 | 306 | 310 | 314 | 318 |
| | 8 | 8 | 12 | 16 | 20 | 24 | 28 | 32 | 300 | 304 | 308 | 312 | 316 | 320 |
| | 10 | 10 | 14 | 18 | 22 | 26 | 30 | 34 | 302 | 306 | 310 | 314 | 318 | 322 |
| | 12 | 12 | 16 | 20 | 24 | 28 | 32 | 36 | 304 | 308 | 312 | 316 | 320 | 324 |
| | 14 | 14 | 18 | 22 | 26 | 30 | 34 | 38 | 306 | 310 | 314 | 318 | 322 | 326 |
| | 16 | 16 | 20 | 24 | 28 | 32 | 36 | 40 | 308 | 312 | 316 | 320 | 324 | 328 |
| | 18 | 18 | 22 | 26 | 30 | 34 | 38 | 42 | 310 | 314 | 318 | 322 | 326 | 330 |
| | ⋮ | | | | | | | | | | | | | |
| | 288 | 288 | 292 | 296 | 300 | 304 | 308 | 312 | 580 | 584 | 588 | 592 | 596 | 600 |
| | 290 | 290 | 294 | 298 | 302 | 306 | 310 | 314 | 582 | 586 | 590 | 594 | 598 | 602 |
| | 292 | 292 | 296 | 300 | 304 | 308 | 312 | 316 | 584 | 588 | 592 | 596 | 600 | 604 |
| | 294 | 294 | 298 | 302 | 306 | 310 | 314 | 318 | 586 | 590 | 594 | 598 | 602 | 606 |
| | 296 | 296 | 300 | 304 | 308 | 312 | 316 | 320 | 588 | 592 | 596 | 600 | 604 | 608 |
| | 298 | 298 | 302 | 306 | 310 | 314 | 318 | 322 | 590 | 594 | 598 | 602 | 606 | 610 |
| | 300 | 300 | 304 | 308 | 312 | 316 | 320 | 324 | 592 | 596 | 600 | 604 | 608 | 612 |
| | 302 | 302 | 306 | 310 | 314 | 318 | 322 | 326 | 594 | 598 | 602 | 606 | 610 | 614 |
| | 304 | 304 | 308 | 312 | 316 | 320 | 324 | 328 | 596 | 600 | 604 | 608 | 612 | 616 |
| | 306 | 306 | 310 | 314 | 318 | 322 | 326 | 330 | 598 | 602 | 606 | 610 | 614 | 618 |
| | 308 | 308 | 312 | 316 | 320 | 324 | 328 | 332 | 600 | 604 | 608 | 612 | 616 | 620 |
| | 310 | 310 | 314 | 318 | 322 | 326 | 330 | 334 | 602 | 606 | 610 | 614 | 618 | 622 |
| | 312 | 312 | 316 | 320 | 324 | 328 | 332 | 336 | 604 | 608 | 612 | 616 | 620 | 624 |

*Figure 22*

ROBUST SYSTEM FOR TRANSMITTING AND RECEIVING MAP DATA

RELATED APPLICATIONS

This application is a continuation-in-part of U.S. application Ser. No. 10/663,953 filed Sep. 16, 2003 which is a continuation-in-part of U.S. application Ser. No. 10/368,737 filed Feb. 18, 2003 which is continuation-in-part of U.S. application Ser. No. 10/345,609 filed Jan. 16, 2003 now abandoned which is a continuation-in-part of U.S. application Ser. No. 10/282,394 filed Oct. 29, 2002 which is a continuation-in-part of U.S. application Ser. No. 10/011,333 filed Dec. 3, 2001 now U.S. Pat No. 6,563,436 which claims the benefit of U.S. Provisional Application No. 60/324,096 filed on Sep. 22, 2001. U.S. application Ser. No. 09/804,262 contains disclosure similar in part to disclosure of this application.

TECHNICAL FIELD OF THE INVENTION

The present invention relates to packing and separating data segments in a data field.

BACKGROUND OF THE INVENTION

The ATSC digital television standard presently provides for the transmission of successive data fields each comprising 313 segments extending over a 24.2 ms time interval. FIG. 1 discloses an exemplary format for a data field according to this standard. The first segment of each field is a field sync segment. The field sync segment is composed of four two-level segment sync symbols and space for 828 other two-level symbols. A portion of this space is used for a field sync, and another portion of this field is reserved. Except for the reserved portion, the information in the frame sync segment does not change from field to field. Each of the remaining 312 segments (numbered 0 through 311) of each field comprises four two-level segment sync symbols and 828 n-level data symbols where n is currently eight, although n could be other integers such as two, four, sixteen, etc. Except for the segment sync portion, it is highly likely that the data in the remaining segments of the fields change from field to field.

As indicated by U.S. patent application Ser. No. 09/804, 262 filed on Mar. 13, 2001, there is presently some interest in extending the ATSC digital television standard to allow a field to contain a mix of more robustly coded data (referred to herein as E-VSB data) and the data currently provided for in the standard (referred to herein as VSB data). Preferably, the data mix is employed on a segment-by-segment basis such that some segments of a field are used to transmit VSB data exclusively and the remaining segments of the field are used to transmit E-VSB segments exclusively. However, it is possible that all data segments of a field could contain either E-VSB data segments exclusively or VSB data segments exclusively. Moreover, it is also possible that the E-VSB data contained in some segments of a field may be coded with one robust coding rate and that the E-VSB data in other segments of the field may be coded at other robust coding rates.

As disclosed in the above mentioned '262 application, a map that indicates which segments contain the more robust (E-VSB) data and which segments contain standard VSB data is preferably provided by the transmitter to the receiver so that the receiver can properly decode and otherwise process the received VSB and E-VSB data. Assuming that a field contains E-VSB data at different coding rates, the map in that case must also designate the coding rates that apply to the differently coded E-VSB data segments.

The '262 application describes one mapping system. Co-pending U.S. patent application Ser. No. 10/011,900 filed December 3, 2001 as well as the '333 application describe another mapping system that reliably identifies which segments contain first data (such as VSB data) and which segments contain second data (such as E-VSB data).

Multipath distortion, commonly found on terrestrial television channels, can affect the ability of the receiver to properly receive and process the map. For example, in the case of map data transmitted in the reserved portion of the field sync segment, data that tends to be random from field to field will be superimposed on the map data if a ghost is a long ghost such that it occurs in the data of a data segment rather than in the field sync segment. If the map and its duplicate are transmitted in two successive field sync segments, the map and its duplicate add with a high degree of correlation when a map and its duplicate are averaged in a receiver, but the superimposed data add with a much lower degree of correlation. Thus, the map is more easily distinguished from the data. Accordingly, the map is readily detectable.

On the other hand, if the ghost is a short ghost such that it occurs in the frame sync segment of a field, frame sync symbols that may not vary from field to field are superimposed on both the map and the duplicate. Accordingly, while the map and its duplicate add with a high degree of correlation, the superimposed field sync symbols also add with a high degree of correlation. Thus, the map cannot be easily distinguished from the field sync symbols. Accordingly, the map is difficult to detect.

As indicated in the aforementioned '394 application, interleaving is used to minimize the adverse effects of burst noise. However, as discussed more fully below, there is a latency that is inherent from the interleaving of the map that is used to indicate where in a frame the receiver can find the various data. This latency results because any one map, due to the interleaving, is spread out over a number of frames so that the map cannot be completely received until all of the frames over which it is spread are received. As a result, the latency associated with interleaving significantly increases receiver acquisition time.

Moreover, while interleaving generally protects against a noise burst impairing all of the map bits or symbols in a particular field, the effectiveness of such protection is reduced in the event of multiple noise bursts in that or subsequent fields. Repeated noise bursts could prevent effective reception of the map even though the robust and other data in the frame are received without appreciable degradation.

One or more of the applications listed above disclose arrangements that allow maps to be more easily detected even in the presence of noise bursts.

The '953 application cited above discloses another map configuration in which maps are used to indicate legal mixes of E-VSB segments in a field. The packing or distribution of these E-VSB segments in a field can produce jitter in the received signal. This jitter is caused by the non-uniform distribution of the E-VSB segments throughout the field. The present invention is directed to the packing or distribution of E-VSB segments in a field so as to reduce jitter.

SUMMARY OF THE INVENTION

In accordance with one aspect of the present invention, a method is provided to receive a field. The field comprises E-VSB data segments containing E-VSB data and VSB data segments containing VSB data. The method comprises the following: receiving the field containing a map that designates the data segment mix contained in the received field; decoding the received map to determine the number of E-VSB data segments in the received field; determining the locations of at least the E-VSB data segments in the received field according to the following expression:

$$s = Int(k*156/P) \text{ for } k=0 \text{ to } k=(2*P-1)$$

wherein P is the number of E-VSB data segments in the received field divided by two, wherein s designates segment number, wherein Int designates a rounding down operation, and wherein k varies from 0 to 2*P−1; and, separating at least one of the received E-VSB and VSB data segments according to the segment number s.

In accordance with another aspect of the present invention, a method is provided to transmit a field. The field comprises E-VSB data segments and VSB data segments, the E-VSB data segments contain E-VSB data, and the VSB data segments contain VSB data. The method comprises the following: generating a map for the field, wherein the map defines the number of the E-VSB data segments in the field; inserting the map into the field; inserting data into at least the E-VSB data segments of the field in accordance with segment numbers s, wherein s is determined according to the following expression:

$$s = Int(k*156/P) \text{ for } k=0 \text{ to } k=(2*P-1)$$

wherein P is the number of E-VSB segments in the corresponding field divided by two, wherein Int designates a rounding down operation, and wherein k varies from 0 to 2*P−1; and, transmitting the field.

In accordance with still another aspect of the present invention, a method is provided to receive a field. The field contains a number of E-VSB data segments and a number of VSB data segments. The method comprises the following: receiving the field containing a map that indicates at least the number of E-VSB data segments contained in the received field; determining the locations of at least the E-VSB data segments in the received field based on a distribution of the E-VSB data segments in which the spacing between E-VSB segments comprises only x and x+1, wherein x is dependent on the number of E-VSB data segments in the field as indicated by the map; and, separating the received E-VSB data segments and the VSB data segments according to the determined locations.

In accordance with yet another aspect of the present invention, a method is provided to transmit a field containing a number of E-VSB data segments and a number of VSB data segments. The method comprises the following: generating a map for the field, wherein the map indicates at least the number of E-VSB data segments in the field; inserting the map into the field; inserting data into at least the E-VSB data segments of the field in accordance with segment numbers s, wherein the spacing between segment numbers s comprises only x and x+1, and wherein x is dependent on the number of E-VSB data segments in the field as indicated by the map; and, transmitting the field.

BRIEF DESCRIPTION OF THE DRAWINGS

These and other features and advantages of the present invention will become more apparent from a detailed consideration of the invention when taken in conjunction with the drawings in which.

DETAILED DESCRIPTION

In order to indicate which segments of a field contain VSB data and which segments of a field contain E-VSB data, a twelve bit map data unit (mdu) is defined for each data field. Accordingly, the map data unit is capable of designating one of 4096 possible combinations of VSB and E-VSB data segments for a respective field. The map data unit for an odd ATSC transmitted field may be denoted as $(A_0 \ B_0 \ C_0)$, and the map data unit for the next succeeding even ATSC transmitted field may be denoted as $\{A_e \ B_e \ C_e\}$, where $A_0$, $B_0$, $C_0$, $A_e$, $B_e$, and $C_e$ each comprises four bits and is referred to herein as a map data sub-unit. Thus, each map data unit comprises twelve bits and two map data units for successive odd and even fields comprise twenty-four bits.

Figures 1, 2:
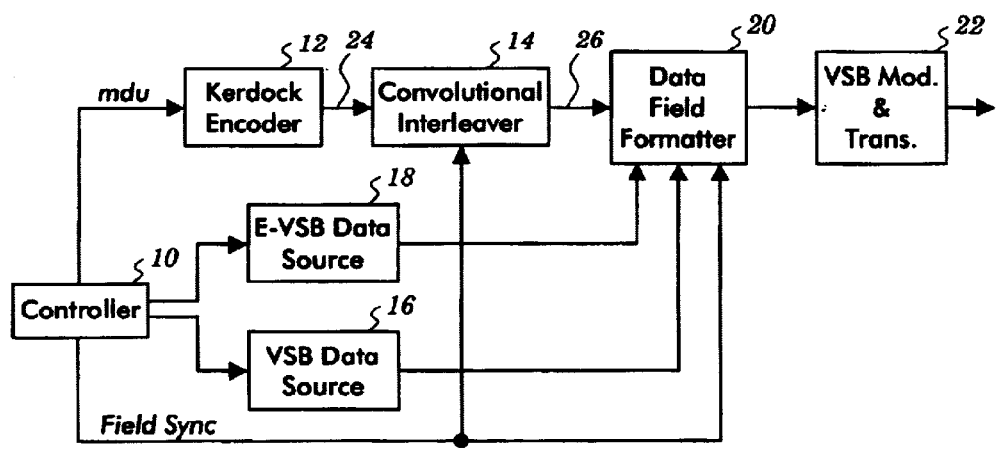
FIG. 1 is a diagram illustrating an exemplary format of a field as defined in the ATSC digital television standard.
FIG. 2 is a schematic diagram of a map insertion system that inserts a map into fields to be transmitted.

As shown in FIG. 2, a controller 10 generates a sequence of map data units for application to a Kerdock encoder 12. Kerdock encoders that may be used for the Kerdock encoder 12 are disclosed below. Eight bits at a time are supplied to the Kerdock encoder 12. Thus, the first eight bits supplied to the Kerdock encoder 12 correspond to map data sub-units $A_0$ $B_0$, the next eight bits supplied to the Kerdock encoder 12 correspond to map data sub-units $C_0$ $A_e$, and the next eight bits supplied to the Kerdock encoder 12 correspond to map data sub-units $B_e$ $C_e$. The map data units for succeeding fields are applied to the Kerdock encoder 12 in a like fashion.

For each eight bit input, the Kerdock encoder 12 produces a sixteen bit code word or vector that consists of the eight input bits and eight parity bits $P_x$. Accordingly, for input map data sub-units $A_0$ $B_0$, the output of the Kerdock encoder 12 is a code word or vector $\{A_0\ B_0\ P_1\}$; for map data sub-units $C_0$ $A_e$, the output of the Kerdock encoder 12 is $\{C_0\ A_e\ P_2\}$; and, for map data sub-units $B_e$ $C_e$, the output of the Kerdock encoder 12 is $\{B_e\ C_e\ P_3\}$. Thus, three map data sub-units covering successive odd and even fields n and n+1 are thereby encoded into three sixteen bit output vectors containing forty-eight bits in all.

The code vectors that are produced by the Kerdock encoder 12 are processed by a convolutional interleaver 14 in order to provide protection from burst noise. Convolutional interleavers and de-interleavers are described in the ATSC digital television standard. An interleaver that may be used for the convolutional interleaver 14 is disclosed in U.S. Pat. No. 5,572,532. The convolutional interleaver 14 is preferably characterized by the parameters N=48, B=16 and M=3, where N is M times the block size (16 data elements) corresponding to three encoded map vectors produced by the Kerdock encoder 12, B is the interleave depth, and M is the delay unit size of the interleaver. Thus, the convolutional interleaver 14 delays the individual bits of the forty-eight bits of each block of three code vectors by 0, 3, 6, ..., 45 bits at the output of the convolutional interleaver 14.

The convolutional interleaver 14 is preferably synchronized to the ATSC field sync signal that is generated by the controller 10 so that the successive delays on the input bits are reset at the end of each field. Accordingly, each field begins with zero delay. As will be explained in further detail hereinafter, each set of forty-eight interleaved bits of the blocks of three code vectors are duplicated for transmission as two level symbols in the reserved portion of two consecutive field sync segments. It will be appreciated that this Kerdock coding and duplication results in an effective coding rate of ¼ because the map bits are doubled in number by the Kerdock encoder 12 and are doubled in number again by the duplication, so that twenty-four bits representing two map data units are coded into ninety-six bits in two field sync segments.

It will also be appreciated that, considering the corresponding de-interleaver in the receiver, a latency interval L must be accounted for when associating the map data units with the corresponding fields. The latency interval of the interleaver/de-interleaver combination is given by the expression L=N×(B−1). In the specific example of the convolutional interleaver 14 given above, N=48 and B=16. Therefore, the latency interval of the interleaver/de-interleaver combination according to this example is L=48× 15=720 bits or 15 (720/48) fields. If two additional fields are allowed for processing time, the system may be characterized by the following relationships:

Coded mdu for field $n$: $A_0B_0P_1C_0A_EP_2B_EC_EP_3$

Coded mdu for field $n+1$: $A_0B_0P_1C_0A_EP_2B_EC_EP_3$ where mdu $A_0B_0C_0$ identifies the mix of VSB and E-VSB segments for field n+2+L and where mdu $A_EB_EC_E$ identifies the mix of VSB and E-VSB segments for field n+3+L.

A VSB data source 16 provides VSB data and an E-VSB data source 18 provides E-VSB data. One result of the Kerdock encoding applied by the Kerdock encoder 12 is that the mdus are more robustly encoded than are the VSB data and the E-VSB data. The controller 10 controls the VSB data source 16 and the E-VSB data source 18 so as to control the mix of VSB and E-VSB data segments in a particular field. Because of the system latency interval, the map data unit, which notifies the receiver of this mix and which is encoded by the Kerdock encoder 12, is transmitted beginning in a field that is transmitted 17 or 18 fields earlier than the field containing that mix and ends in a field that is transmitted 1 or 2 fields earlier that the field containing that mix. That is, the map data unit supplied by the controller 10 to the Kerdock encoder 12 during formatting of the current field corresponds to VSB and/or E-VSB data to be transmitted 17 or 18 fields later. However, because of the interleaving performed by the convolutional interleaver 38, this map data unit is spread over 15 fields.

The data segments supplied by the VSB data source 16 and the E-VSB data source 18, together with the encoded and interleaved map data unit bits from the convolutional interleaver 14, are applied to a data field formatter 20. The data field formatter 20 is synchronized to the field sync signal from the controller 10 and formats the transmitted field so that the forty-eight encoded and interleaved map data unit bits are inserted into the reserved portion of two successive field sync segments. The VSB data source 16 and the E-VSB data source 18 are controlled by the controller 10 so that the VSB and E-VSB data segments supplied by the VSB data source 16 and the E-VSB data source 18 to the data field formatter 20 correspond to a map data unit transmitted beginning n+2+L or n+3+L fields prior thereto. The data field formatter 20 is synchronized so that these VSB and E-VSB data segments are appropriately multiplexed throughout the current field in accordance with that previously transmitted map data unit.

Finally, the formatted fields are successively applied to a standard ATSC modulator and transmitter 22 for transmission.

Figure 3:
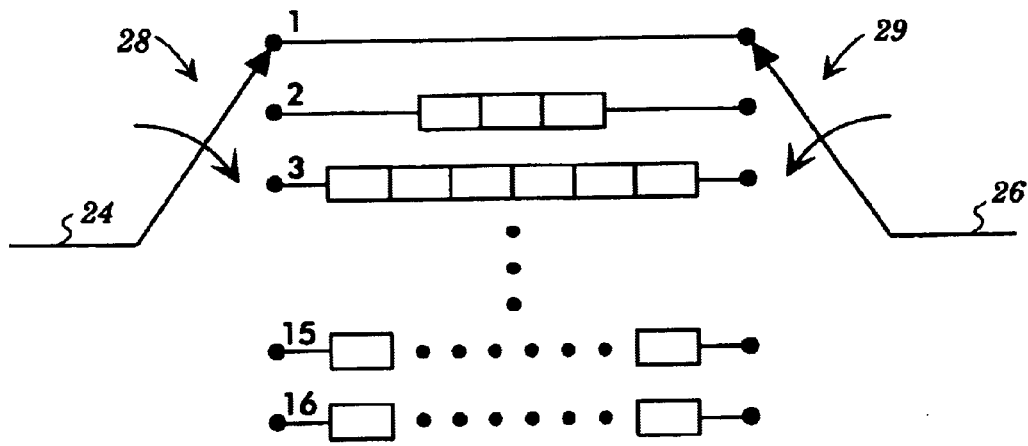
FIG. 3 shows an example of a convolutional interleaver that can be used in the map insertion system shown in FIG. 2.

An example of the convolutional interleaver 14 is shown in FIG. 3 and includes sixteen paths coupled between an input 24 and an output 26 by corresponding synchronized switching functions 28 and 29. As shown in FIG. 2, the input 24 is coupled to the Kerdock encoder 12 and the output 26 is coupled to the data field formatter 20. The switching functions 28 and 29 synchronously step through the sixteen paths on a data element-by-data element basis so that one data element received on the input 24 is coupled through the first path to the output 26, so that the next data element received on the input 24 is coupled through the second path to the output 26, and so on.

The first path of the convolutional interleaver 14 imposes no delay on the data elements passing therethrough, the second path of the convolutional interleaver 14 imposes a three element delay on the data elements passing therethrough, the third path of the convolutional interleaver 14 imposes a six element delay on the data elements passing therethrough, . . . , and the sixteenth path of the convolutional interleaver 14 imposes a forty-five element delay on the data elements passing therethrough.

Figure 4:
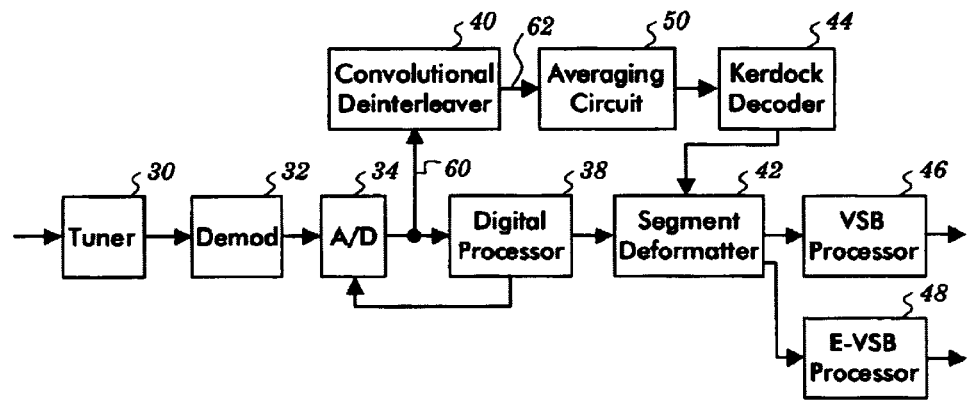
FIG. 4 is a schematic diagram of a portion of a receiver involved in de-formatting a received field based upon a received map.

As shown in FIG. 4, the signal transmitted by the ATSC modulator and transmitter 22 is received by a receiver comprising a tuner 30. The IF output of the tuner 30 is demodulated by an ATSC demodulator 32 in order to provide an analog baseband output representing the transmitted symbols. This analog signal is sampled by an A/D converter 34 under control of a digital processor 38 to convert the demodulated symbols into corresponding multi-bit digital values. The encoded and interleaved map data unit symbols, which are duplicated in successive fields as discussed above, are applied to a convolutional de-interleaver 40. The remaining symbols are directly applied to the digital processor 38, which converts these remaining symbols to corresponding bits, arranged in data bytes, for application to a segment de-formatter 42. The segment de-formatter 42 receives a de-interleaved and decoded map data unit from a Kerdock decoder 44. The segment de-formatter 42 responds to this de-interleaved and decoded map data unit by passing the VSB segments in the field to a VSB processor 46 and by passing the E-VSB segments in the field to an E-VSB processor 48. The VSB processor 46 and the E-VSB processor 48 decode and otherwise process the respective VSB data and E-VSB data from the segment de-formatter 42.

As an example, the VSB processor 46 may perform Reed-Solomon decoding and, in the case where the VSB data has been trellis encoded in the transmitter, the VSB processor 46 may also perform Viterbi decoding. The E-VSB processor 48, for example, may perform the same decoding as the VSB processor 46 and, in addition, perform the additional decoding corresponding to the additional coding that was performed in the transmitter in order to add robustness to the data. Moreover, the VSB processor 46 and the E-VSB processor 48 may perform de-interleaving and de-randomization.

The interleaved map data unit symbols from the A/D converter 34 are applied to the convolutional de-interleaver 40 which de-interleaves the map data unit symbols in inverse fashion relative to the convolutional interleaver 14 in order to provide the vectors produced by the Kerdock encoder 12. The de-interleaved vectors corresponding to a map data unit and to its corresponding duplicate map data unit are averaged on a bit-by-bit basis by an averaging circuit 50 in order to improve the reliability of the map data units. The de-interleaved and averaged vectors are decoded by the Kerdock decoder 44 in order to recover the map data units that control the segment de-formatter 42. Since the mdus were encoded more robustly than either the VSB data or the E-VSB data, the mdus will be recovered in the receiver with less errors than the data.

As explained previously, the latency interval of the interleave/de-interleave process is accommodated in the system because the map data units provided by the controller 10 define the mix of VSB and E-VSB data segments that are to be transmitted L fields later in time. Exemplary embodiments of the Kerdock decoder 44 and the convolutional de-interleaver 40 are disclosed in the previously referenced U.S. Pat. Nos. 6,226,318 B1 and 5,572,532 respectively.

As discussed below in more detail, the Kerdock decoder 44 may be arranged to provide an estimation of the reliability of the decoding process. In terms of the map data unit specifically, the Kerdock decoder 44 may be arranged to provide an estimation of the reliability of the decoding of the map data unit. If this reliability indicates that the decoded map data unit is not reliable, the immediately previous map data unit that was reliably decoded is used to de-format the field instead of the currently decoded map data unit. This operation is justified by assuming that the mix between VSB data and E-VSB data changes from field to field at a relatively slow rate so that the substitute map data unit will likely define the appropriate segment mix.

Figure 5:
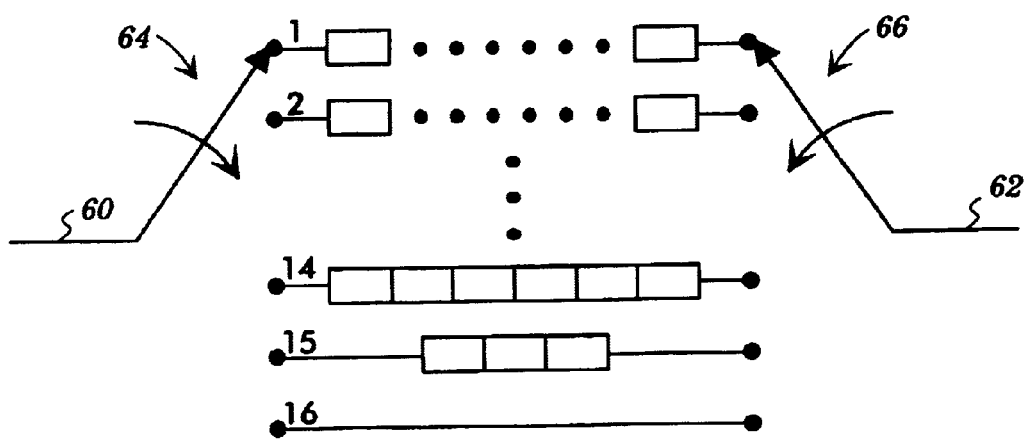
FIG. 5 shows an example of a convolutional de-interleaver that can be used in the receiver portion shown in FIG. 4.

An example of the convolutional de-interleaver 40 is shown in FIG. 5 and includes sixteen paths coupled between an input 60 and an output 62 by corresponding synchronized switching functions 64 and 66. As shown in FIG. 4, the input 60 is coupled to the A/D converter 34 and the output 62 is coupled to the averaging circuit 50. The switching functions 64 and 66 synchronously step through the sixteen paths on a data element-by-data element basis so that one data element received on the input 60 is coupled through the first path to the output 62, so that the next data element received on the input 60 is coupled through the second path to the output 62, and so on.

The first path of the convolutional de-interleaver 40 imposes a forty-five element delay on the data elements passing therethrough, the second path of the convolutional interleaver 14 imposes a forty-two delay on the data elements passing therethrough, . . . , the fourteenth path of the convolutional interleaver 14 imposes a six element delay on the data elements passing therethrough, the fifteenth path of the convolutional interleaver 14 imposes a three element delay on the data elements passing therethrough, and the sixteenth path of the convolutional interleaver 14 imposes no delay on the data elements passing therethrough.

Figure 6:
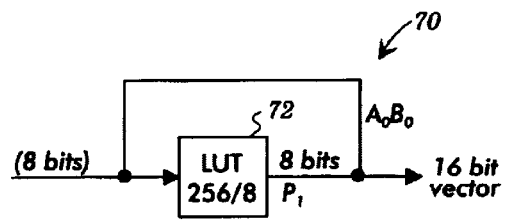
FIG. 6 shows a first embodiment of a Kerdock encoder that can be used in the map insertion system shown in FIG. 2.

A systematic Kerdock encoder 70 is shown in FIG. 6 and may be used for the Kerdock encoder 12. The systematic Kerdock encoder 70 accepts an input having N data elements, such as the map data sub-units $A_0$ and $B_0$ having a total of eight bits, and outputs a corresponding code word having 2N data elements, such as the code word $\{A_0\ B_0\ P_1\}$ having a total of sixteen bits, by appending N parity bits, such as the eight parity bits $P_1$, to the end of the N input data elements, such as the map data sub-units $A_0$ and $B_0$ having eight bits. The N parity data elements are read out of a look-up table 72 based on the N input data elements.

In the case where each map data sub-unit is four bits so that two map data sub-units are eight bits, the look-up table 72 stores 256 sets of parity bits where each set contains eight bits. Appendix A shows exemplary data for the look-up table 72. Each bit in this exemplary data has one of only two values, 1 or −1. In describing the relationship between the input bits and the sets of parity bits stored in the look-up table, it is useful to think of a bit having a value of −1 as a bit having a value of 0. The eight bits that are provided as an input to the systematic Kerdock encoder 70 are used as an address into the look-up table 72.

The data stored in the look-up table 72 are arranged so that, when a set of eight parity bits is read out according to eight input bits and is appended to the eight input bits, a Kerdock code word is formed. A Kerdock code word has a minimum distance of six from any other Kerdock code word. Distance is a measure of how many corresponding bits differ between two code words.

The relationship between the input bits and the bits stored in the look-up table 72 fosters the creation of the Kerdock code words that are output by the systematic Kerdock encoder 70. This relationship is as follows: the input bits having a value of −1 −1 −1 −1 −1 −1 −1 −1 (i.e., the address 0) are used to address the first row of Appendix A; the input bits having a value of −1 −1 −1 −1 −1 −1 −1 1 (i.e., the address 1) are used to address the second row of Appendix A; the input bits having a value of −1 −1 −1 −1 −1 −1 1 −1 (i.e., the address 2) are used to address the third row of Appendix A; the input bits having a value of −1 −1 −1 −1 −1 −1 1 1 1 (i.e., the address 3) are used to address the fourth row of Appendix A; and so on.

As an example, when the input −1 −1 −1 −1 −1 −1 −1 −1 is received by the systematic Kerdock encoder 70, the first row of Appendix A is read out from the look-up table 72 and is appended to this input to form the Kerdock code word −1 −1 −1 −1 −1 −1 −1 −1 −1 1 −1 1 1 −1 1 −1. As another example, when the input −1 −1 −1 −1 −1 −1 −1 1 is received by the systematic Kerdock encoder 70, the second row of Appendix A is read out from the look-up table 72 and is appended to this input to form the Kerdock code word −1 −1 −1 −1 −1 −1 −1 1 1 −1 −1 −1 1 1 −1 −1. It is noted that these two Kerdock code words have a distance of six from each other because the eighth, ninth, tenth, twelfth, fourteenth, and fifteenth bits are different between the two Kerdock code words.

Figure 7:
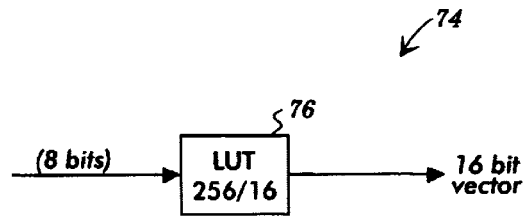
FIG. 7 shows a second embodiment of a Kerdock encoder that can be used in the map insertion system shown in FIG. 2.

Alternatively, a systematic Kerdock encoder 74 is shown in FIG. 7 and may be used for the Kerdock encoder 12. The systematic Kerdock encoder 74 accepts an input having N data elements, such as the map data sub-units $A_0$ and $B_0$ having a total of eight bits, and outputs a corresponding code word having 2N data elements, such as the code word {$A_0$ $B_0$ $P_1$} having a total of sixteen bits, by reading out the 2N data element code word from a look-up table 76.

In the case where each map data sub-unit is four bits so that two map data sub-units are eight bits, the look-up table 76 stores 256 code words where each code word contains sixteen bits. Appendix B shows exemplary data for the look-up table 76. As in the case of Appendix A, each bit in this exemplary data has one of only two values, 1 or −1. The eight bits that are provided as an input to the systematic Kerdock encoder 74 are used as an address into the look-up table 76 and correspond to the first eight bits of a row in the data shown in Appendix B. The row of Appendix B that is addressed by a set of eight input bits is the row in which the first eight bits match the eight input bits. Each code word stored in the look-up table 76 is a Kerdock code word because each code word stored in the look-up table 76 has a minimum distance of six from any other Kerdock code word stored in the look-up table 76.

As an example, when the input −1 −1 −1 −1 −1 −1 −1 −1 is received by the systematic Kerdock encoder 74, a row 78 of Appendix A is read out from the look-up table 76. The row 78 contains the following bits: −1 −1 −1 −1 −1 −1 −1 −1 1 −1 1 1 −1 1 −1. As another example, when the input −1 −1 −1 −1 −1 −1 −1 1 is received by the systematic Kerdock encoder 74, a row 80 of Appendix A is read out from the look-up table 76. The row 80 contains the following bits: −1 −1 −1 −1 −1 −1 −1 1 1 −1 −1 −1 1 1 −1 −1. It is noted that these two Kerdock code words have a distance of six from each other because the eighth, ninth, tenth, twelfth, fourteenth, and fifteenth bits are different between the two Kerdock code words.

Figure 8:
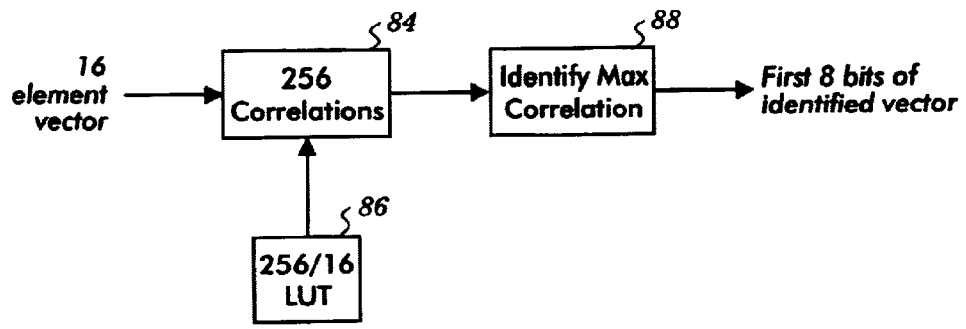
FIG. 8 shows a first embodiment of a Kerdock decoder that can be used in the receiver portion shown in FIG. 4.

A systematic Kerdock decoder 82 is shown in FIG. 8 and may be used for the Kerdock decoder 44. The systematic Kerdock decoder 82 accepts an input having 2N data elements, such as eight bits corresponding to the map data sub-units $A_0$ and $B_0$ and 8 bits corresponding to the parity bits, and outputs a vector of N data elements, such as the map data sub-units $A_0$ and $B_0$ having eight bits.

More specifically, a correlator 84 correlates the 2N input data elements with each of 256 Kerdock code words stored in a look-up table 86, where each Kerdock code word comprises sixteen data elements such as bits. Appendix B shows exemplary data for the look-up table 86. The correlation implemented by the correlator 84, for example, may be a dot product of the input 2N data elements and each of the Kerdock code words stored in the look-up table 86.

Thus, the first data element of the 2N input data elements is multiplied by the first data element of a first Kerdock code word stored in the look-up table 86 to form a first product, the second data element of the 2N input data elements is multiplied by the second data element of the first Kerdock code word stored in the look-up table 86 to form a second product, . . . , and the sixteenth data element of the 2N input data elements is multiplied by the sixteenth data element of the first Kerdock code word stored in the look-up table 86 to form a sixteenth product. The resulting sixteen products are added to form a first correlation between the 2N input data elements and the first Kerdock code word stored in the look-up table 86. This process is repeated for each of the other 255 Kerdock code words stored in the look-up table 86.

An identifier 88 identifies the Kerdock code word from the look-up table 86 that produced the largest correlation and outputs the first eight data elements of this Kerdock code word as the eight data elements making up two map data sub-units of a map data unit to be applied to the segment de-formatter 42. The identifier 88 may also form the difference between the largest correlation and the next largest correlation as a reliability factor that indicates the reliability with which the 2N input data elements have been decoded.

Figure 9:
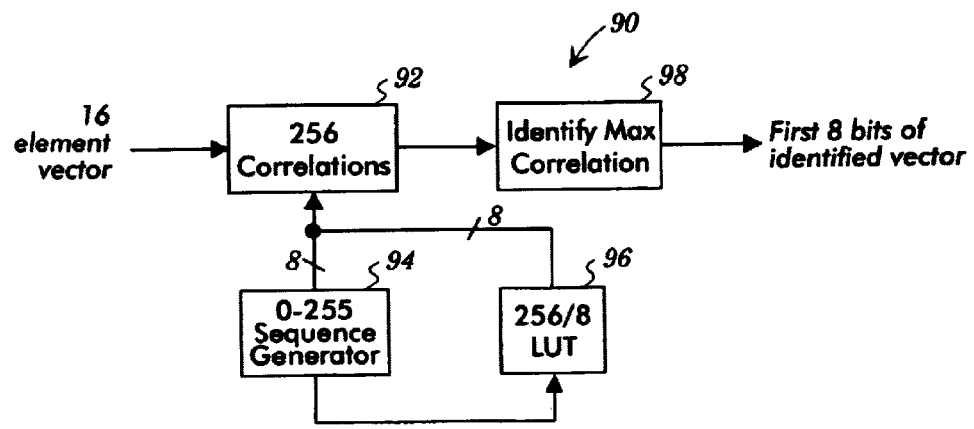
FIG. 9 shows a second embodiment of a Kerdock decoder that can be used in the receiver portion shown in FIG. 4.

Alternatively, a systematic Kerdock decoder 90 is shown in FIG. 9 and may be used for the Kerdock decoder 44. The systematic Kerdock decoder 90 accepts an input having 2N data elements, such as the map data sub-units $A_0$ and $B_0$ having eight bits and the corresponding eight parity bits $P_1$, and outputs a vector having N data elements, such as the map data sub-units $A_0$ and $B_0$ having eight bits.

More specifically, a correlator 92 correlates the 2N input data elements with each of 256 Kerdock code words that are supplied to the correlator 92 from a sequence generator 94 and a look-up table 96. Each Kerdock code word supplied to the correlator 92 from the sequence generator 94 and the look-up table 96 comprises sixteen data elements such as bits. The correlation implemented by the correlator 92, for example, may be the same correlation as implemented by the correlator 84.

The first eight bits of the first Kerdock code word supplied to the correlator 92 comprises a first sequence of eight bits generated by the sequence generator 94. For example, this first sequence may be −1 −1 −1 −1 −1 −1 −1 −1 (i.e., 0). The second eight bits of the first Kerdock code word supplied to the correlator 92 comprise eight bits read out of the look-up table 96 based on an address corresponding to the eight bits generated by the sequence generator 94. These two sets of eight bits are appended together and are supplied to the correlator 92.

Appendix A shows exemplary data for the look-up table 96. The relationship between the input bits from the sequence generator 94 and the bits stored in the look-up table 96 may be the same as that used by the systematic Kerdock encoder 70. Accordingly, the input bits having a value of −1 −1 −1 −1 −1 −1 −1 −1 (i.e., the address 0) are used to address the first row of Appendix A, the input bits having a value of −1 −1 −1 −1 −1 −1 −1 1 (i.e., the address 1) are used to address the second row of Appendix A, and so on.

The correlator 92 produces a first correlation based upon the input 2N bits and the first Kerdock code word produced by the sequence generator 94 and the look-up table 96.

The first eight bits of the second Kerdock code word supplied to the correlator 92 comprises a second sequence of eight bits generated by the sequence generator 94. For example, this second sequence may be −1 −1 −1 −1 −1 −1 −1 1 (i.e., 1). The second eight bits of the second Kerdock code word supplied to the correlator 92 comprise eight bits read out of the look-up table 96 based on an address corresponding to the eight bits generated by the sequence generator 94. These two sets of eight bits are appended together and are supplied to the correlator 92.

The correlator 92 produces a second correlation word produced by the sequence generator 94 and the look-up table 96, and so on.

An identifier 98 identifies the Kerdock code word from the sequence generator 94 and the look-up table 96 that produced the largest correlation and outputs the first eight data elements of this Kerdock code word as the eight data elements making up two map data sub-units of a map data unit to be applied to the segment de-formatter 42. The identifier 98 may also form the difference between the largest correlation and the next largest correlation as a reliability factor indicating the reliability with which the 2N input data elements have been decoded.

Figure 10:
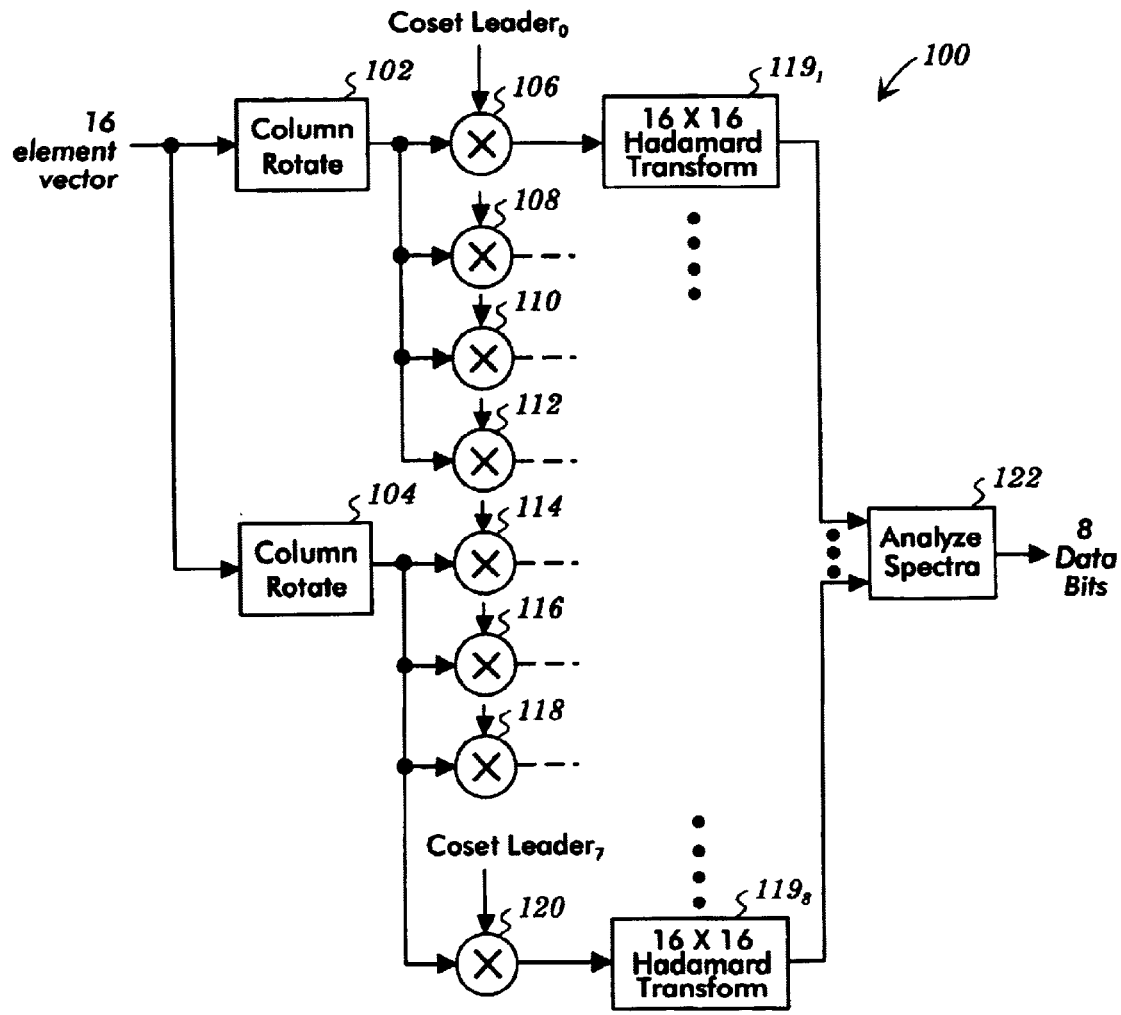
FIG. 10 shows a third embodiment of a Kerdock decoder that can be used in the receiver portion shown in FIG. 4.

As a further alternative, a systematic decoder 100 shown in FIG. 10 may be used for the Kerdock decoder 44. The systematic decoder 100 is a modified form of the non-systematic decoder disclosed in U.S. Pat. No. 6,226,318 B1. The systematic decoder 100 includes two column rotators 102 and 104, and eight vector multipliers 106, 108, 110, 112, 114, 116, 118, and 120. The modification involves the addition of the two column rotators to the non-systematic decoder disclosed in U.S. Pat. No. 6,226,318 B1.

Appendix C shows the coset leaders that are applied to first inputs of the multipliers 106, 108, 110, 112, 114, 116, 118, and 120. Accordingly, the coset leader in the first row of Appendix C is applied to the first input of the multiplier 106, the coset leader in the second row of Appendix C is applied to the first input of the multiplier 108, the coset leader in the third row of Appendix C is applied to the first input of the multiplier 110, . . . , and the coset leader in the eighth row of Appendix C is applied to the first input of the multiplier 120.

The input sixteen data elements to be decoded are re-arranged (such as rotated) according to the first column of the following table and this rotated input is applied to each of the second inputs of the multipliers 106, 108, 110, and 112. The input to be decoded is rotated according to the second column of the following table and this rotated input is applied to each of the second inputs of the multipliers 114, 116, 118, and 120.

TABLE

| | |
|---|---|
| 4"1 | 4"1 |
| 15"2 | 15"2 |
| 14"3 | 14"3 |
| 9"4 | 9"4 |
| 5"5 | 6"5 |
| 12"6 | 11"6 |
| 7"7 | 8"7 |
| 2"8 | 1"8 |
| 3"9 | 3"9 |
| 16"10 | 16"10 |
| 13"11 | 13"11 |
| 10"12 | 10"12 |
| 6"13 | 5"13 |
| 11"14 | 12"14 |
| 8"15 | 7"15 |
| 1"16 | 2"16 |

According to the first column of the above table, the fourth input data element is moved to the first data element position of the output to be supplied to the second inputs of the multipliers 106, 108, 110, and 112, the fifteenth input data element is moved to the second data element position of the output to be supplied to the second inputs of the multipliers 106, 108, 110, and 112, the fourteenth input data element is moved to the third data element position of the output to be supplied to the second inputs of the multipliers 106, 108, 110, and 112, . . . , and the first input data element is moved to the sixteenth data element position of the output to be supplied to the second inputs of the multipliers 106, 108, 110, and 112. Accordingly, the sixteen data element input is rotated by the column rotator 102 to form a sixteen data element output to be supplied to the second inputs of the multipliers 106, 108, 110, and 112.

Similarly, the second column of the above table shows the rotation imposed by the column rotator 104 on the sixteen input data elements to form a sixteen data element output to be supplied to the second inputs of the multipliers 114, 116, 118, and 120. The column rotators 102 and 104 in effect convert a systematic code vector to a non-systematic code vector.

The outputs of the multipliers 106, 108, 110, 112, 114, 116, 118, and 120 are processed by a corresponding one of 16×16 Hadamard transforms $119_1$–$119_8$ to produce corresponding spectra that are analyzed by a spectral analyzer 122. The spectral analyzer 122 determines which spectra contains the largest coefficient and decodes the largest coefficient to produce the corresponding Kerdock code word. The first eight bits of this Kerdock code word are supplied by the spectral analyzer 122 as the eight data elements making up two map data sub-units of a map data unit to be applied to the segment de-formatter 42. The spectral analyzer 122 may also form the difference between the largest coefficient and the next largest coefficient as a reliability factor indicating the reliability with which the 2N input data elements have been decoded.

Figure 11A:
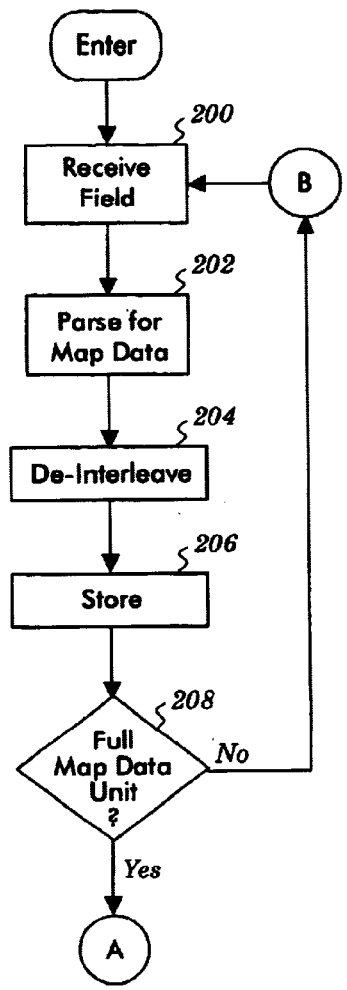
FIGS. 11A and 11B are flow charts illustrating the operation of the receiver portion shown in FIG. 4.
Figure 11B:
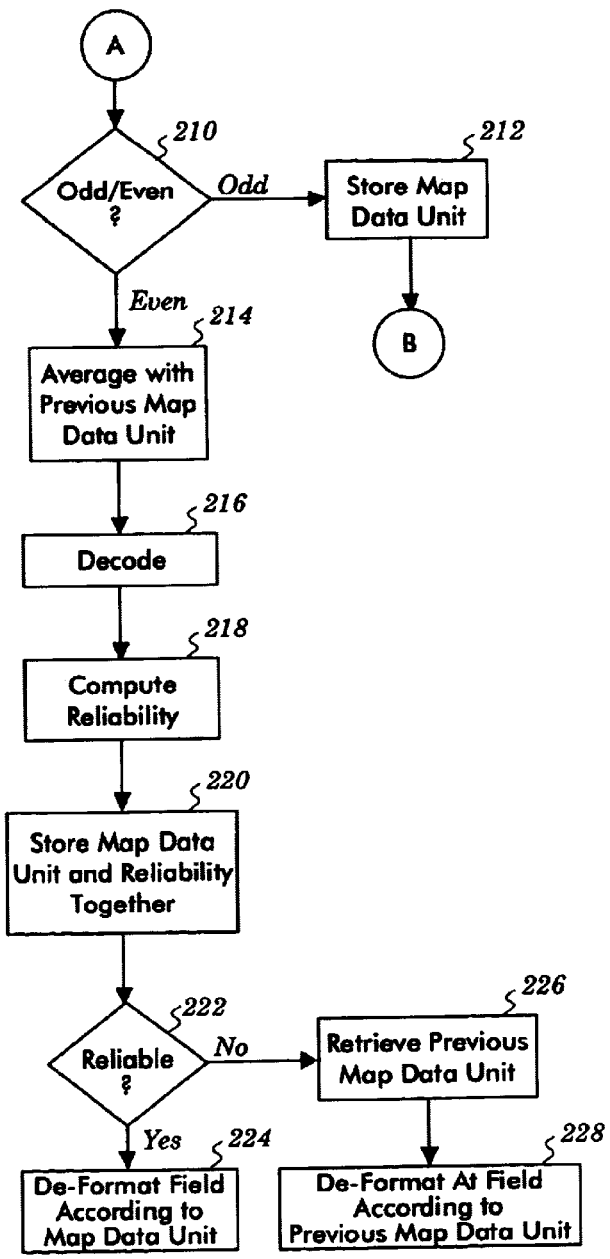

The receiving arrangement shown in FIG. 4 performs the functions illustrated by the flow chart of FIGS. 11A and 11B. A block 200 receives a field, and a block 202 parses the field in order to recover the map data unit symbols. A block 204 de-interleaves the map data unit symbols, and a block 206 stores the de-interleaved map data unit symbols in a memory. When a full map data unit has been de-interleaved as determined by a block 208, a block 210 determines whether this map data unit corresponds to an odd field or an even field. If the block 210 determines that this map data unit corresponds to an odd field, a block 212 simply stores the map data unit awaiting de-interleaving and decoding of the duplicate of this data map unit because data map units transmitted in odd fields are duplicated in even fields. After the non-duplicate map data unit is stored by the block 212, flow returns to the block 200.

If the block 210 determines that this map data unit corresponds to an even field, the recovered map data unit is a duplicate of the map data unit previously de-interleaved and decoded. Accordingly, a block 214 averages the current map data unit and the previous map data unit. A block 216 decodes the map data unit average, and a block 218 computes a reliability factor for the map data unit average. A block 220 stores the average map and the corresponding reliability factor.

A block 222 determines whether the reliability factor of a decoded map data unit corresponding to the field received at the block 200 indicates that the decoded map data unit has been reliably decoded. If the reliability factor indicates reliable decoding, a block 224 de-formats the field corresponding to the appropriate map data unit and sends the VSB data and/or the E-VSB data to the VSB processor 46 and/or the E-VSB processor 48, as appropriate, in accordance with the de-formatting.

On the other hand, if the reliability factor indicates that the decoding was not reliable as determined at the block 222, a block 226 retrieves the immediately previous map data unit that was reliably decoded, and a block 228 de-formats the field in accordance with the retrieved immediately previous map data unit and sends the VSB data and/or the E-VSB data to the VSB processor 46 and/or the E-VSB processor 48, as appropriate, in accordance with the de-formatting.

APPENDIX A

```
{  -1,   1,  -1,   1,   1,  -1,   1,  -1,  },
{   1,  -1,  -1,  -1,   1,   1,  -1,  -1,  },
{   1,  -1,   1,   1,  -1,  -1,   1,   1,  },
{  -1,   1,   1,  -1,  -1,   1,  -1,   1,  },
{  -1,  -1,  -1,  -1,  -1,  -1,  -1,   1,  },
{   1,   1,   1,   1,  -1,  -1,   1,   1,  },
{   1,   1,  -1,   1,  -1,   1,  -1,  -1,  },
{  -1,  -1,   1,   1,   1,   1,   1,  -1,  },
{   1,   1,   1,   1,   1,   1,  -1,   1,  },
{  -1,  -1,   1,  -1,   1,   1,   1,   1,  },
{  -1,  -1,   1,  -1,   1,  -1,  -1,  -1,  },
{   1,   1,  -1,  -1,  -1,  -1,   1,  -1,  },
{   1,  -1,   1,  -1,  -1,   1,   1,  -1,  },
{  -1,   1,  -1,   1,  -1,  -1,  -1,  -1,  },
{  -1,   1,  -1,  -1,   1,   1,   1,   1,  },
{   1,  -1,  -1,   1,   1,  -1,  -1,   1,  },
{   1,   1,  -1,  -1,  -1,  -1,  -1,  -1,  },
{  -1,  -1,  -1,  -1,  -1,   1,   1,  -1,  },
{   1,   1,  -1,   1,   1,   1,   1,   1,  },
{  -1,   1,   1,   1,  -1,   1,   1,   1,  },
{   1,   1,   1,  -1,  -1,   1,   1,  -1,  },
{   1,  -1,   1,  -1,   1,   1,  -1,   1,  },
{  -1,   1,  -1,  -1,   1,  -1,  -1,  -1,  },
{   1,  -1,  -1,  -1,   1,  -1,   1,   1,  },
{  -1,   1,  -1,   1,   1,   1,  -1,   1,  },
{  -1,  -1,  -1,  -1,  -1,  -1,  -1,   1,  },
{   1,  -1,   1,  -1,   1,  -1,  -1,   1,  },
{  -1,  -1,  -1,  -1,   1,  -1,  -1,  -1,  },
{  -1,   1,  -1,  -1,  -1,   1,   1,  -1,  },
{   1,  -1,  -1,   1,  -1,  -1,  -1,   1,  },
{   1,   1,   1,   1,  -1,   1,   1,   1,  },
{  -1,  -1,  -1,  -1,   1,   1,  -1,   1,  },
{   1,   1,  -1,   1,   1,   1,   1,  -1,  },
{   1,   1,   1,  -1,   1,   1,  -1,   1,  },
{  -1,   1,   1,  -1,   1,  -1,  -1,  -1,  },
{  -1,  -1,   1,  -1,   1,  -1,   1,   1,  },
{  -1,  -1,   1,  -1,   1,   1,  -1,   1,  },
{   1,  -1,   1,   1,   1,  -1,   1,  -1,  },
{   1,   1,   1,   1,  -1,   1,   1,  -1,  },
{  -1,  -1,  -1,  -1,  -1,  -1,  -1,  -1,  },
{  -1,   1,  -1,   1,   1,   1,  -1,   1,  },
{  -1,   1,   1,   1,   1,   1,   1,  -1,  },
{   1,   1,   1,   1,  -1,   1,   1,  -1,  },
{  -1,   1,  -1,  -1,  -1,  -1,  -1,   1,  },
{  -1,   1,   1,  -1,   1,  -1,  -1,  -1,  },
{   1,  -1,   1,   1,   1,  -1,  -1,  -1,  },
{   1,   1,  -1,   1,  -1,   1,   1,   1,  },
{  -1,   1,   1,   1,   1,  -1,   1,   1,  },
{   1,   1,  -1,   1,  -1,  -1,   1,   1,  },
{  -1,  -1,  -1,  -1,   1,  -1,   1,  -1,  },
{  -1,  -1,   1,   1,   1,  -1,  -1,   1,  },
{   1,   1,   1,  -1,   1,   1,  -1,  -1,  },
{   1,  -1,  -1,   1,   1,  -1,  -1,   1,  },
{  -1,   1,  -1,  -1,  -1,  -1,   1,   1,  },
{   1,   1,   1,   1,   1,  -1,  -1,  -1,  },
{   1,  -1,   1,  -1,   1,  -1,   1,   1,  },
{  -1,  -1,   1,  -1,  -1,   1,   1,  -1,  },
{  -1,  -1,  -1,   1,   1,   1,   1,   1,  },
{  -1,   1,   1,  -1,   1,   1,  -1,  -1,  },
{   1,   1,   1,  -1,   1,   1,   1,  -1,  },
{  -1,  -1,   1,  -1,  -1,  -1,  -1,  -1,  },
{  -1,   1,  -1,   1,   1,   1,   1,   1,  },
{   1,  -1,   1,   1,   1,  -1,   1,   1,  },
{   1,  -1,  -1,  -1,  -1,  -1,  -1,  -1,  },
{  -1,   1,  -1,   1,  -1,   1,   1,  -1,  },
```

APPENDIX A-continued

```
{   1,   1,  -1,  -1,  -1,   1,   1,   1,  },
{  -1,  -1,   1,  -1,  -1,  -1,   1,  -1,  },
{  -1,  -1,  -1,   1,   1,   1,  -1,   1,  },
{   1,   1,   1,   1,   1,  -1,  -1,  -1,  },
{  -1,   1,   1,  -1,   1,   1,  -1,  -1,  },
{   1,  -1,   1,   1,  -1,   1,  -1,   1,  },
{   1,  -1,  -1,  -1,   1,  -1,   1,  -1,  },
{  -1,   1,  -1,   1,  -1,   1,   1,   1,  },
{   1,  -1,   1,  -1,  -1,  -1,  -1,  -1,  },
{  -1,   1,  -1,  -1,   1,  -1,  -1,   1,  },
{   1,   1,  -1,  -1,  -1,   1,  -1,   1,  },
{   1,   1,   1,  -1,   1,   1,  -1,   1,  },
{   1,  -1,   1,  -1,   1,   1,   1,   1,  },
{  -1,  -1,   1,  -1,  -1,  -1,   1,   1,  },
{   1,  -1,  -1,   1,  -1,   1,  -1,   1,  },
{  -1,   1,  -1,  -1,   1,  -1,  -1,  -1,  },
{  -1,   1,  -1,  -1,  -1,   1,  -1,  -1,  },
{  -1,   1,   1,  -1,   1,  -1,  -1,  -1,  },
{  -1,   1,  -1,  -1,   1,  -1,   1,   1,  },
{  -1,   1,  -1,  -1,  -1,  -1,   1,  -1,  },
{   1,  -1,  -1,  -1,   1,   1,   1,   1,  },
{  -1,  -1,  -1,  -1,   1,   1,   1,  -1,  },
{  -1,  -1,   1,  -1,   1,  -1,  -1,  -1,  },
{  -1,  -1,  -1,  -1,   1,  -1,  -1,  -1,  },
{   1,  -1,   1,  -1,  -1,  -1,   1,  -1,  },
{  -1,  -1,   1,  -1,   1,  -1,   1,  -1,  },
{   1,  -1,   1,  -1,  -1,   1,  -1,  -1,  },
{   1,  -1,  -1,  -1,   1,   1,  -1,   1,  },
{  -1,   1,   1,  -1,  -1,  -1,   1,   1,  },
{   1,   1,  -1,   1,  -1,  -1,   1,  -1,  },
{   1,  -1,  -1,   1,  -1,   1,   1,   1,  },
{  -1,   1,  -1,   1,   1,  -1,   1,   1,  },
{   1,  -1,  -1,  -1,   1,   1,  -1,   1,  },
{  -1,  -1,   1,  -1,   1,  -1,   1,  -1,  },
{   1,   1,  -1,  -1,  -1,  -1,  -1,  -1,  },
{  -1,  -1,  -1,  -1,  -1,   1,  -1,   1,  },
{   1,   1,   1,   1,   1,   1,  -1,   1,  },
{  -1,   1,  -1,   1,  -1,   1,  -1,   1,  },
{  -1,  -1,   1,   1,   1,   1,  -1,   1,  },
{   1,   1,  -1,  -1,   1,  -1,  -1,  -1,  },
{  -1,   1,  -1,   1,  -1,  -1,   1,  -1,  },
{   1,   1,  -1,  -1,  -1,  -1,  -1,   1,  },
{   1,  -1,   1,   1,   1,   1,   1,  -1,  },
{  -1,   1,  -1,  -1,  -1,  -1,  -1,  -1,  },
{   1,  -1,  -1,  -1,  -1,  -1,   1,  -1,  },
{   1,  -1,   1,  -1,   1,   1,  -1,   1,  },
{  -1,  -1,  -1,  -1,  -1,  -1,  -1,  -1,  },
{  -1,   1,   1,   1,  -1,   1,   1,   1,  },
{  -1,  -1,  -1,   1,  -1,   1,  -1,   1,  },
{  -1,  -1,  -1,   1,   1,  -1,  -1,  -1,  },
{   1,  -1,   1,  -1,  -1,  -1,  -1,   1,  },
{   1,   1,  -1,   1,  -1,  -1,  -1,  -1,  },
{  -1,   1,   1,  -1,   1,  -1,   1,  -1,  },
{   1,   1,   1,  -1,   1,   1,  -1,   1,  },
{   1,  -1,  -1,  -1,   1,  -1,   1,   1,  },
{  -1,  -1,   1,   1,  -1,  -1,   1,   1,  },
{  -1,   1,  -1,  -1,  -1,   1,   1,   1,  },
{  -1,  -1,   1,  -1,  -1,  -1,   1,  -1,  },
{   1,   1,   1,  -1,  -1,   1,  -1,  -1,  },
{   1,   1,  -1,  -1,   1,  -1,  -1,   1,  },
{  -1,   1,   1,  -1,  -1,  -1,  -1,   1,  },
{  -1,  -1,  -1,   1,  -1,  -1,   1,  -1,  },
```

APPENDIX A-continued

```
{  1,  1,  1,  1, -1,  1,  1,  1, },
{ -1,  1, -1, -1,  1,  1, -1,  1, },
{  1, -1,  1, -1, -1,  1,  1,  1, },
{  1, -1, -1,  1,  1, -1, -1, -1, },
{ -1,  1,  1,  1, -1, -1,  1, -1, },
{ -1, -1,  1, -1,  1, -1,  1, -1, },
{  1,  1,  1,  1,  1,  1, -1, -1, },
{  1,  1, -1,  1, -1,  1,  1,  1, },
{ -1, -1, -1,  1, -1,  1, -1,  1, },
{  1,  1, -1,  1, -1,  1,  1, -1, },
{ -1, -1, -1, -1, -1, -1, -1, -1, },
{ -1, -1,  1,  1,  1,  1,  1,  1, },
{  1,  1,  1, -1,  1, -1, -1,  1, },
{ -1,  1,  1, -1, -1, -1,  1,  1, },
{ -1,  1, -1,  1,  1, -1,  1,  1, },
{ -1,  1,  1, -1, -1,  1, -1, -1, },
{  1, -1, -1, -1,  1,  1,  1,  1, },
{  1, -1, -1, -1, -1, -1,  1, -1, },
{ -1,  1,  1, -1, -1, -1, -1, -1, },
{ -1,  1, -1,  1, -1,  1,  1,  1, },
{  1,  1, -1, -1,  1, -1, -1,  1, },
{  1,  1,  1,  1,  1, -1,  1,  1, },
{ -1, -1, -1,  1, -1, -1,  1,  1, },
{ -1, -1,  1, -1,  1,  1, -1, -1, },
{  1,  1, -1,  1,  1, -1,  1, -1, },
{ -1,  1,  1, -1,  1, -1, -1,  1, },
{  1,  1, -1, -1,  1,  1,  1,  1, },
{  1,  1,  1,  1, -1, -1, -1, -1, },
{ -1, -1,  1,  1,  1,  1,  1,  1, },
{ -1,  1,  1,  1,  1,  1,  1, -1, },
{  1, -1, -1,  1, -1,  1, -1, -1, },
{  1, -1,  1,  1, -1,  1,  1,  1, },
{ -1,  1, -1, -1,  1, -1,  1,  1, },
{  1,  1, -1, -1,  1, -1,  1,  1, },
{ -1, -1,  1,  1,  1, -1,  1,  1, },
{ -1, -1,  1, -1, -1, -1, -1,  1, },
{ -1, -1,  1, -1, -1, -1, -1, -1, },
{ -1, -1,  1, -1,  1, -1, -1,  1, },
{  1, -1,  1, -1,  1,  1, -1,  1, },
{ -1,  1,  1,  1,  1, -1,  1,  1, },
{ -1,  1,  1, -1,  1,  1, -1, -1, },
{  1, -1,  1, -1,  1, -1,  1,  1, },
{ -1,  1, -1,  1,  1, -1,  1, -1, },
{ -1, -1,  1,  1, -1,  1,  1,  1, },
{  1,  1,  1,  1, -1, -1,  1, -1, },
{  1,  1, -1,  1, -1,  1, -1,  1, },
{ -1, -1,  1,  1, -1,  1, -1, -1, },
{  1, -1,  1,  1, -1, -1,  1,  1, },
{ -1,  1, -1,  1,  1, -1,  1, -1, },
{ -1, -1, -1,  1, -1,  1, -1, -1, },
{  1, -1, -1,  1, -1,  1,  1, -1, },
{  1,  1, -1,  1,  1,  1,  1, -1, },
{ -1, -1, -1,  1, -1,  1,  1,  1, },
{  1, -1,  1, -1,  1, -1,  1,  1, },
{ -1,  1, -1,  1, -1,  1,  1,  1, },
{ -1, -1, -1,  1,  1, -1,  1,  1, },
{  1, -1,  1,  1,  1,  1, -1, -1, },
{ -1,  1,  1, -1,  1, -1,  1, -1, },
{ -1, -1, -1,  1, -1, -1,  1,  1, },
{  1,  1, -1, -1,  1, -1,  1, -1, },
```

APPENDIX A-continued

```
{  1,  1,  1,  1, -1,  1, -1,  1, },
{ -1, -1,  1, -1,  1,  1, -1, -1, },
{  1, -1, -1, -1, -1,  1, -1, -1, },
{ -1,  1,  1, -1, -1, -1, -1,  1, },
{ -1,  1, -1,  1,  1,  1,  1, -1, },
{  1, -1,  1,  1,  1, -1,  1,  1, },
{ -1,  1,  1,  1,  1, -1, -1, -1, },
{  1, -1, -1,  1,  1,  1, -1,  1, },
{  1,  1,  1, -1, -1, -1,  1, -1, },
{ -1,  1, -1, -1, -1,  1,  1,  1, },
{  1,  1,  1, -1,  1,  1,  1,  1, },
{ -1, -1,  1,  1, -1,  1,  1, -1, },
{ -1, -1, -1, -1,  1, -1, -1,  1, },
{  1,  1, -1,  1, -1, -1, -1, -1, },
{  1,  1, -1,  1,  1,  1, -1, -1, },
{ -1, -1, -1, -1, -1,  1, -1,  1, },
{ -1, -1,  1,  1,  1, -1,  1, -1, },
{  1,  1, -1,  1, -1, -1,  1,  1, },
{ -1,  1, -1, -1, -1, -1,  1,  1, },
{  1, -1,  1, -1,  1,  1, -1,  1, },
{ -1,  1, -1,  1, -1,  1, -1, -1, },
{  1, -1,  1, -1,  1,  1,  1,  1, },
{  1, -1, -1,  1, -1, -1, -1,  1, },
{ -1,  1, -1,  1, -1, -1, -1, -1, },
{ -1, -1, -1,  1,  1,  1,  1,  1, },
{  1,  1, -1, -1, -1, -1,  1, -1, },
{  1,  1, -1, -1, -1, -1, -1,  1, },
{ -1,  1,  1, -1, -1,  1, -1,  1, },
{ -1, -1, -1,  1, -1,  1, -1, -1, },
{ -1, -1, -1,  1, -1,  1, -1, -1, },
{  1,  1,  1,  1,  1,  1,  1, -1, },
{  1, -1, -1,  1, -1, -1,  1, -1, },
{ -1,  1, -1, -1,  1,  1, -1, -1, },
{ -1,  1, -1,  1, -1, -1,  1,  1, },
{  1, -1,  1, -1, -1,  1, -1,  1, }
```

APPENDIX B

```
{  1, -1, -1, -1,  1,  1,  1,  1,  1,  1,  1, -1,  1,  1,  1, },
{ -1,  1, -1, -1,  1,  1,  1,  1, -1, -1, -1, -1, -1,  1, -1, -1, },
{ -1,  1, -1, -1,  1,  1, -1, -1, -1, -1,  1,  1,  1, -1,  1,  1, },
{  1, -1, -1, -1,  1,  1, -1, -1,  1,  1, -1, -1,  1, -1, -1, -1, },
{ -1,  1, -1, -1, -1, -1, -1, -1,  1,  1, -1, -1, -1,  1,  1,  1, },
{  1, -1, -1, -1, -1, -1, -1, -1, -1, -1,  1,  1, -1,  1, -1, -1, },
```

APPENDIX B-continued

```
{  1, -1, -1, -1, -1, -1,  1,    1, -1, -1, -1, -1,  1, -1,  1,  1, },
{ -1,  1, -1, -1, -1, -1,  1,    1,  1,  1,  1,  1,  1, -1, -1, -1, },
{ -1, -1,  1, -1,  1, -1,  1,   -1,  1, -1, -1,  1,  1,  1,  1, -1, },
{  1,  1,  1, -1,  1, -1,  1,   -1, -1,  1,  1, -1,  1, -1,  1,  1, },
{  1,  1,  1, -1,  1, -1, -1,    1, -1,  1, -1,  1, -1, -1,  1, -1, },
{ -1, -1,  1, -1,  1, -1, -1,    1,  1, -1,  1, -1, -1, -1, -1,  1, },
{  1,  1,  1, -1, -1,  1, -1,    1,  1, -1,  1, -1,  1,  1,  1, -1, },
{ -1, -1,  1, -1, -1,  1, -1,    1,  1,  1, -1,  1,  1,  1,  1,  1, },
{ -1, -1,  1, -1, -1,  1,  1,   -1, -1,  1,  1, -1, -1, -1,  1, -1, },
{  1,  1,  1, -1, -1,  1,  1,   -1,  1, -1, -1,  1, -1, -1, -1,  1, },
{  1,  1, -1, -1,  1,  1,  1,    1, -1,  1,  1, -1,  1, -1,  1, -1, },
{ -1, -1, -1, -1,  1,  1,  1,    1,  1, -1,  1,  1,  1, -1, -1,  1, },
{ -1, -1, -1, -1,  1,  1, -1,   -1,  1, -1,  1, -1, -1, -1,  1, -1, },
{  1,  1, -1, -1,  1,  1, -1,   -1, -1,  1, -1,  1, -1,  1,  1,  1, },
{ -1, -1, -1, -1, -1, -1, -1,   -1, -1,  1, -1,  1,  1, -1,  1, -1, },
{  1,  1, -1, -1, -1, -1, -1,   -1,  1, -1,  1,  1,  1, -1, -1,  1, },
{  1,  1, -1, -1, -1, -1,  1,   -1, -1,  1, -1,  1,  1,  1,  1, -1, },
{ -1, -1, -1, -1, -1, -1,  1,    1, -1,  1,  1, -1, -1,  1, -1,  1, },
{ -1,  1,  1, -1,  1, -1,  1,   -1, -1, -1, -1, -1, -1,  1,  1, -1, },
{  1, -1,  1, -1,  1, -1,  1,   -1,  1,  1,  1, -1, -1, -1, -1, -1, },
{  1, -1,  1, -1,  1, -1, -1,    1,  1,  1,  1,  1,  1,  1,  1,  1, },
{ -1,  1,  1, -1,  1, -1, -1,    1, -1, -1, -1,  1,  1, -1, -1,  1, },
{  1, -1,  1, -1, -1,  1, -1,    1, -1, -1,  1,  1, -1, -1,  1,  1, },
{ -1,  1,  1, -1, -1,  1, -1,    1,  1,  1, -1, -1,  1, -1, -1, -1, },
{ -1,  1,  1, -1, -1,  1,  1,   -1,  1,  1,  1,  1,  1,  1,  1,  1, },
{  1, -1,  1, -1, -1,  1,  1,   -1, -1, -1, -1, -1,  1,  1, -1, -1, },
{  1,  1, -1, -1,  1,  1,  1,   -1,  1, -1, -1, -1, -1,  1,  1,  1, },
{ -1, -1, -1, -1,  1,  1, -1,    1, -1,  1,  1, -1, -1, -1,  1,  1, },
{ -1, -1, -1, -1,  1,  1, -1,    1,  1, -1, -1,  1,  1,  1, -1, -1, },
{  1,  1, -1, -1,  1,  1, -1,   -1,  1, -1, -1, -1, -1, -1, -1, -1, },
{  1, -1,  1, -1,  1, -1, -1,   -1,  1,  1,  1,  1, -1, -1,  1,  1, },
{ -1,  1,  1, -1,  1, -1, -1,    1, -1, -1, -1,  1, -1,  1, -1,  1, },
{  1, -1,  1, -1,  1, -1,  1,   -1, -1, -1, -1,  1,  1, -1, -1,  1, },
{ -1,  1,  1, -1,  1, -1,  1,    1,  1, -1,  1, -1,  1,  1, -1,  1, },
{  1, -1,  1, -1, -1,  1,  1,    1,  1,  1, -1,  1,  1, -1,  1, -1, },
{ -1,  1,  1, -1, -1,  1,  1,   -1, -1,  1, -1,  1, -1, -1,  1,  1, },
{ -1,  1,  1, -1, -1,  1, -1,   -1, -1, -1,  1,  1,  1,  1, -1, -1, },
{  1, -1,  1, -1, -1,  1, -1,    1, -1, -1,  1, -1,  1,  1,  1, -1, },
{  1, -1, -1, -1,  1,  1, -1,   -1, -1, -1,  1, -1, -1, -1,  1,  1, },
{ -1,  1, -1, -1,  1,  1, -1,    1,  1,  1, -1,  1, -1, -1,  1,  1, },
{ -1, -1, -1, -1,  1,  1,  1,    1,  1, -1,  1,  1, -1, -1, -1, -1, },
{  1,  1, -1, -1,  1,  1,  1,   -1,  1,  1,  1, -1,  1,  1,  1, -1, },
{  1, -1, -1, -1, -1,  1,  1,   -1,  1,  1,  1,  1,  1, -1,  1, },
{ -1,  1, -1, -1, -1,  1,  1,   -1, -1, -1,  1, -1, -1, -1,  1, -1, },
{ -1,  1, -1, -1, -1,  1, -1,    1, -1,  1,  1, -1, -1, -1,  1,  1, },
{  1, -1, -1, -1, -1,  1, -1,   -1,  1, -1,  1, -1,  1,  1,  1,  1, },
{ -1, -1,  1, -1,  1, -1, -1,   -1, -1,  1, -1, -1, -1,  1, -1, -1, },
{ -1, -1,  1, -1,  1, -1,  1,    1, -1,  1,  1,  1,  1, -1,  1,  1, },
{  1,  1,  1, -1,  1, -1, -1,    1,  1, -1, -1, -1, -1,  1,  1,  1, },
{  1,  1,  1, -1, -1,  1,  1,   -1,  1, -1,  1,  1, -1,  1, -1, -1, },
{ -1, -1,  1, -1, -1,  1,  1,    1, -1,  1,  1, -1,  1, -1, -1,  1, },
{  1,  1,  1, -1, -1,  1, -1,    1,  1, -1,  1, -1,  1, -1,  1, -1, },
{ -1, -1,  1, -1, -1,  1, -1,   -1, -1,  1,  1, -1,  1, -1, -1,  1, },
{  1,  1, -1, -1,  1,  1,  1,   -1, -1,  1, -1, -1,  1,  1,  1,  1, },
{ -1, -1, -1, -1,  1,  1,  1,   -1,  1, -1, -1,  1, -1,  1,  1, -1, },
{ -1, -1, -1, -1,  1,  1, -1,    1, -1, -1,  1, -1, -1,  1,  1, -1, },
{  1,  1, -1, -1,  1,  1, -1,    1,  1,  1, -1,  1,  1, -1, -1,  1, },
{  1,  1, -1, -1, -1, -1, -1,    1, -1,  1,  1, -1, -1,  1,  1, -1, },
{ -1, -1, -1, -1, -1, -1, -1,   -1,  1,  1, -1, -1, -1,  1, -1,  1, },
{ -1, -1, -1, -1, -1, -1,  1,   -1,  1,  1,  1,  1, -1,  1, -1,  1, },
{  1,  1, -1, -1, -1, -1,  1,    1, -1, -1, -1, -1,  1, -1,  1, -1, },
{ -1,  1, -1, -1, -1,  1,  1,   -1,  1,  1,  1,  1, -1, -1,  1, -1, },
{  1, -1, -1, -1, -1,  1,  1,    1, -1, -1, -1,  1, -1,  1,  1,  1, },
{  1, -1, -1, -1, -1,  1, -1,    1,  1,  1,  1, -1,  1, -1,  1, -1, },
{ -1,  1, -1, -1, -1,  1, -1,   -1, -1, -1, -1, -1, -1, -1, -1, -1, },
{ -1,  1, -1, -1,  1, -1, -1,    1, -1, -1, -1, -1, -1,  1,  1,  1, },
{  1, -1, -1, -1,  1, -1, -1,   -1,  1,  1,  1, -1, -1, -1, -1,  1, },
{  1, -1, -1, -1,  1, -1,  1,   -1,  1,  1,  1,  1, -1, -1,  1,  1, },
{ -1,  1, -1, -1,  1, -1,  1,    1, -1,  1,  1,  1,  1, -1,  1, -1, },
{ -1,  1, -1, -1, -1,  1, -1,    1,  1, -1,  1,  1, -1,  1, -1,  1, },
{  1, -1, -1, -1,  1, -1, -1,    1,  1, -1,  1,  1,  1, -1,  1, -1, },
```

APPENDIX B-continued

```
{ -1,  1, -1, -1,  1, -1, -1,   1, -1,  1, -1, -1,  1, -1, -1,  1, },
{ -1,  1, -1, -1,  1, -1,  1,  -1, -1,  1,  1,  1, -1,  1,  1, -1, },
{  1, -1, -1, -1,  1, -1,  1,  -1,  1, -1, -1, -1, -1,  1, -1,  1, },
{ -1, -1,  1, -1,  1,  1, -1,  -1,  1,  1, -1, -1, -1, -1,  1,  1, },
{  1,  1,  1, -1,  1,  1, -1,  -1, -1, -1,  1, -1, -1, -1, -1, -1, },
{  1,  1,  1, -1,  1,  1,  1,   1, -1, -1, -1,  1,  1,  1,  1,  1, },
{ -1, -1,  1, -1,  1,  1,  1,   1,  1,  1,  1, -1,  1,  1, -1, -1, },
{  1,  1,  1, -1, -1, -1,  1,   1,  1,  1,  1, -1,  1,  1, -1,  1, },
{ -1, -1,  1, -1, -1, -1,  1,   1, -1, -1, -1,  1, -1, -1, -1, -1, },
{ -1, -1,  1, -1, -1, -1, -1,  -1, -1, -1,  1, -1,  1,  1,  1,  1, },
{  1,  1,  1, -1, -1, -1, -1,  -1,  1,  1, -1,  1,  1,  1, -1, -1, },
{ -1,  1, -1, -1,  1,  1,  1,   1, -1,  1,  1, -1,  1,  1,  1,  1, },
{  1, -1, -1, -1,  1,  1,  1,   1,  1, -1,  1, -1, -1, -1, -1,  1, },
{  1, -1, -1, -1, -1,  1, -1,  -1,  1, -1, -1,  1,  1,  1,  1,  1, },
{ -1,  1, -1, -1, -1,  1, -1,  -1, -1,  1,  1, -1,  1,  1, -1, -1, },
{  1, -1,  1, -1,  1, -1, -1,   1, -1,  1,  1, -1,  1,  1,  1,  1, },
{ -1,  1, -1, -1,  1, -1, -1,  -1,  1, -1,  1, -1,  1, -1,  1,  1, },
{ -1,  1, -1, -1,  1, -1,  1,   1, -1,  1, -1,  1, -1,  1, -1,  1, },
{ -1,  1, -1, -1,  1, -1,  1,   1,  1, -1,  1, -1,  1,  1,  1,  1, },
{  1, -1, -1, -1,  1, -1,  1,   1, -1,  1, -1,  1,  1,  1, -1, -1, },
{ -1,  1,  1, -1,  1,  1, -1,   1, -1, -1,  1, -1,  1,  1, -1, -1, },
{  1,  1,  1, -1,  1,  1, -1,   1,  1, -1,  1,  1,  1, -1,  1, -1, },
{  1,  1,  1, -1,  1,  1,  1,  -1,  1,  1, -1, -1, -1,  1, -1,  1, },
{ -1, -1,  1, -1,  1,  1,  1,  -1, -1, -1,  1,  1, -1,  1, -1,  1, },
{  1,  1,  1, -1, -1, -1,  1,  -1, -1, -1,  1,  1,  1, -1,  1,  1, },
{ -1, -1,  1, -1, -1, -1,  1,  -1,  1, -1,  1, -1,  1, -1,  1,  1, },
{ -1, -1,  1, -1, -1, -1, -1,   1,  1,  1,  1, -1,  1,  1,  1, -1, },
{  1,  1,  1, -1, -1, -1, -1,   1, -1, -1, -1, -1,  1, -1,  1,  1, },
{ -1, -1, -1, -1, -1,  1,  1,   1, -1, -1,  1,  1,  1,  1, -1,  1, },
{  1, -1, -1, -1, -1,  1,  1,   1, -1, -1,  1,  1, -1,  1, -1,  1, },
{  1,  1,  1,  1,  1,  1,  1,   1,  1,  1,  1,  1,  1,  1,  1,  1, },
{  1,  1, -1, -1, -1,  1, -1,  -1,  1,  1,  1, -1, -1,  1, -1,  1, },
{ -1, -1, -1, -1, -1,  1, -1,  -1, -1, -1, -1, -1, -1, -1, -1,  1, },
{  1,  1, -1, -1,  1, -1, -1,  -1, -1, -1, -1,  1,  1,  1,  1,  1, },
{ -1, -1, -1, -1,  1, -1, -1,  -1,  1,  1,  1,  1,  1,  1, -1,  1, },
{ -1, -1, -1, -1,  1, -1,  1,   1,  1,  1, -1, -1, -1, -1,  1, -1, },
{  1, -1, -1, -1,  1, -1,  1,   1, -1, -1,  1,  1, -1, -1, -1,  1, },
{ -1,  1,  1, -1,  1,  1, -1,   1, -1,  1,  1,  1, -1, -1,  1,  1, },
{  1, -1,  1, -1,  1,  1, -1,   1,  1, -1,  1, -1,  1,  1, -1,  1, },
{  1, -1,  1, -1,  1,  1,  1,  -1,  1, -1,  1, -1,  1, -1,  1, -1, },
{  1, -1,  1, -1,  1,  1,  1,  -1,  1, -1, -1,  1,  1,  1,  1,  1, },
{ -1,  1,  1, -1,  1,  1,  1,  -1,  1, -1,  1, -1,  1, -1,  1,  1, },
{  1, -1,  1, -1,  1,  1,  1,   1, -1,  1, -1,  1, -1,  1,  1,  1, },
{ -1,  1,  1, -1, -1, -1,  1,  -1,  1, -1,  1,  1, -1,  1,  1, -1, },
{ -1,  1,  1, -1, -1, -1, -1,   1, -1,  1, -1,  1, -1,  1,  1,  1, },
{  1, -1,  1, -1, -1, -1, -1,   1,  1,  1, -1, -1, -1,  1, -1,  1, },
{ -1,  1,  1,  1, -1, -1, -1,   1,  1, -1,  1,  1, -1, -1, -1, -1, },
{  1, -1,  1,  1, -1, -1,  1,  -1, -1,  1,  1, -1,  1, -1,  1,  1, },
{ -1,  1,  1,  1, -1,  1, -1,   1, -1, -1,  1, -1,  1,  1,  1,  1, },
{  1, -1,  1,  1, -1,  1,  1,  -1, -1, -1,  1, -1,  1, -1,  1, -1, },
{ -1,  1,  1,  1,  1,  1,  1,  -1,  1,  1,  1, -1,  1, -1,  1,  1, },
{  1, -1,  1,  1,  1,  1,  1,   1, -1, -1,  1,  1,  1, -1,  1,  1, },
{ -1, -1, -1,  1,  1, -1, -1,   1, -1,  1, -1,  1, -1,  1, -1,  1, },
{ -1, -1,  1,  1, -1, -1, -1,  -1,  1, -1, -1,  1, -1,  1, -1,  1, },
{  1,  1,  1,  1, -1, -1,  1,   1, -1,  1, -1,  1, -1,  1, -1, -1, },
{ -1, -1, -1,  1,  1, -1,  1,  -1, -1,  1, -1,  1, -1, -1, -1,  1, },
{  1, -1, -1,  1,  1,  1,  1,  -1,  1,  1,  1, -1,  1, -1, -1, -1, },
{ -1, -1, -1,  1,  1, -1,  1,  -1,  1, -1, -1, -1, -1, -1,  1,  1, },
{  1,  1, -1,  1, -1,  1, -1,   1, -1,  1,  1, -1, -1, -1, -1,  1, },
{ -1, -1, -1,  1,  1, -1,  1,   1,  1, -1, -1,  1,  1,  1,  1, -1, },
{ -1, -1, -1,  1, -1,  1,  1,  -1,  1, -1,  1,  1,  1,  1,  1,  1, },
{  1,  1, -1,  1, -1,  1,  1,  -1, -1,  1, -1,  1,  1,  1,  1, -1, },
{ -1, -1, -1,  1,  1, -1,  1,  -1, -1,  1, -1,  1, -1, -1, -1,  1, },
{  1,  1,  1,  1,  1,  1,  1,   1, -1,  1, -1, -1,  1, -1,  1,  1, },
{ -1, -1,  1,  1, -1,  1,  1,   1, -1,  1,  1, -1,  1,  1,  1, -1, },
{ -1, -1,  1,  1, -1,  1, -1,  -1,  1,  1, -1,  1, -1,  1, -1,  1, },
{  1,  1,  1,  1, -1,  1, -1,   1,  1,  1,  1,  1,  1,  1,  1,  1, },
{ -1, -1,  1,  1, -1, -1,  1,  -1,  1, -1,  1,  1,  1,  1, -1,  1, },
{  1, -1,  1, -1,  1, -1,  1,   1,  1, -1,  1, -1,  1,  1,  1,  1, },
{ -1, -1,  1,  1, -1, -1,  1,  -1,  1, -1,  1,  1,  1,  1, -1,  1, },
{ -1,  1, -1,  1, -1, -1,  1,  -1,  1,  1,  1,  1,  1, -1, -1,  1, },
{  1,  1,  1,  1, -1, -1,  1,  -1,  1, -1, -1, -1,  1,  1,  1,  1, },
{  1,  1,  1,  1, -1, -1, -1,   1,  1, -1,  1,  1, -1, -1, -1, -1, },
```

APPENDIX B-continued

```
{ -1, -1,  1,  1, -1, -1, -1,  1, -1,  1, -1, -1, -1, -1,  1,  1, },
{  1,  1,  1,  1,  1,  1, -1,  1, -1,  1, -1, -1,  1,  1, -1, -1, },
{ -1, -1,  1,  1,  1,  1, -1,  1,  1, -1,  1,  1,  1,  1,  1,  1, },
{ -1, -1,  1,  1,  1,  1,  1, -1,  1, -1, -1, -1, -1, -1, -1,  1, },
{  1,  1,  1,  1,  1,  1,  1, -1, -1,  1,  1, -1, -1,  1,  1, },
{  1, -1, -1,  1, -1,  1,  1,  1, -1, -1, -1,  1, -1,  1, -1,  1, },
{ -1,  1, -1,  1, -1,  1,  1,  1,  1,  1,  1, -1, -1,  1,  1, -1, },
{ -1,  1, -1,  1, -1,  1,  1, -1,  1,  1,  1,  1, -1, -1,  1, },
{  1, -1, -1,  1, -1,  1, -1, -1, -1, -1,  1, -1,  1, -1,  1, -1, },
{ -1,  1, -1,  1,  1, -1, -1, -1, -1, -1,  1, -1, -1,  1, -1,  1, },
{  1, -1, -1,  1,  1, -1, -1, -1,  1,  1, -1,  1, -1,  1,  1, -1, },
{  1, -1,  1,  1,  1, -1,  1,  1,  1,  1,  1, -1,  1, -1,  1, },
{ -1,  1, -1,  1, -1,  1,  1,  1, -1, -1, -1,  1,  1, -1,  1, -1, },
{  1, -1,  1,  1, -1, -1,  1, -1, -1, -1,  1, -1, -1, -1, -1,  1, },
{ -1,  1,  1,  1, -1, -1,  1, -1,  1, -1,  1, -1, -1,  1, -1, },
{ -1,  1,  1,  1, -1, -1, -1,  1,  1, -1,  1,  1,  1, -1,  1, },
{  1, -1,  1,  1, -1, -1, -1,  1, -1, -1, -1,  1,  1,  1,  1, -1, },
{ -1,  1,  1,  1,  1, -1,  1, -1, -1, -1,  1, -1, -1, -1,  1, },
{  1, -1,  1,  1,  1, -1,  1,  1,  1, -1, -1, -1,  1, -1, },
{  1, -1,  1,  1,  1,  1, -1,  1,  1, -1,  1,  1, -1,  1,  1, },
{ -1,  1,  1,  1,  1,  1, -1,  1,  1, -1,  1, -1,  1, -1,  1, },
{ -1, -1, -1,  1, -1,  1,  1,  1,  1, -1, -1,  1, -1,  1, -1, -1, },
{  1,  1, -1,  1, -1,  1,  1,  1, -1,  1,  1,  1, -1,  1,  1, },
{  1,  1, -1,  1, -1,  1, -1,  1, -1, -1, -1,  1, -1,  1, -1, },
{ -1, -1, -1,  1, -1,  1, -1, -1, -1,  1,  1,  1, -1,  1,  1, },
{  1,  1, -1,  1, -1, -1, -1, -1,  1,  1,  1, -1, -1, -1, },
{ -1, -1, -1,  1, -1, -1, -1, -1,  1, -1,  1, -1,  1,  1, },
{  1,  1,  1,  1, -1, -1,  1, -1, -1,  1, -1,  1, -1,  1,  1, },
{  1,  1,  1,  1, -1,  1, -1, -1, -1, -1,  1,  1, -1, -1, },
{ -1, -1,  1,  1, -1,  1, -1, -1,  1, -1,  1,  1,  1,  1, },
{  1,  1,  1,  1, -1,  1,  1, -1,  1,  1,  1, -1,  1, -1, -1, },
{ -1, -1,  1,  1, -1,  1,  1, -1, -1, -1, -1,  1, -1,  1,  1, },
{ -1, -1,  1,  1, -1,  1, -1,  1, -1,  1, -1,  1, -1,  1, -1, },
{  1,  1,  1,  1, -1,  1, -1,  1,  1,  1,  1, -1,  1,  1, },
{ -1,  1, -1,  1, -1, -1,  1,  1, -1, -1, -1, -1, -1,  1, },
{  1, -1, -1,  1, -1, -1,  1,  1, -1,  1,  1, -1, -1,  1, -1, },
{  1, -1, -1,  1, -1, -1, -1, -1,  1, -1, -1,  1,  1, -1,  1, },
{ -1,  1, -1,  1, -1, -1, -1,  1,  1,  1,  1,  1,  1, -1, },
{  1, -1,  1,  1, -1,  1, -1, -1,  1,  1, -1, -1,  1, -1, },
{ -1,  1, -1,  1,  1,  1, -1, -1,  1, -1, -1, -1, -1,  1, -1, },
{ -1,  1, -1,  1,  1,  1,  1,  1, -1,  1,  1,  1,  1, -1,  1, },
{  1, -1, -1,  1,  1,  1,  1,  1, -1, -1, -1,  1,  1, -1, },
{  1,  1,  1,  1,  1, -1, -1,  1,  1, -1, -1, -1,  1,  1, -1, },
{ -1,  1,  1,  1,  1, -1, -1,  1, -1, -1, -1,  1,  1, -1, },
{  1,  1,  1, -1,  1, -1,  1, -1,  1, -1,  1,  1, -1,  1, -1, },
{ -1, -1,  1,  1,  1, -1,  1,  1, -1,  1,  1,  1, -1,  1, },
{ -1,  1,  1,  1, -1,  1,  1, -1,  1,  1, -1,  1, -1,  1, -1, },
{  1, -1,  1,  1, -1,  1,  1,  1, -1, -1,  1, -1, -1,  1, -1, },
{ -1,  1, -1,  1, -1,  1,  1, -1, -1,  1,  1, -1,  1,  1, },
{ -1, -1,  1,  1, -1,  1,  1, -1,  1, -1, -1, -1, -1, -1, -1, },
{  1, -1,  1,  1,  1, -1,  1,  1, -1, -1, -1,  1,  1,  1,  1, },
{ -1,  1,  1,  1,  1,  1, -1,  1,  1, -1,  1, -1, -1,  1, -1, },
{  1, -1,  1,  1, -1,  1, -1,  1, -1, -1, -1,  1, -1,  1, },
{  1,  1,  1,  1, -1,  1, -1,  1, -1,  1, -1,  1, -1,  1, -1, },
{  1, -1,  1,  1, -1, -1,  1,  1, -1,  1,  1, -1,  1, -1,  1, },
{ -1,  1, -1,  1, -1, -1,  1,  1, -1, -1, -1,  1,  1, -1, },
{ -1,  1,  1,  1, -1, -1, -1, -1,  1, -1, -1, -1, -1, -1, -1, },
{  1,  1, -1,  1, -1, -1,  1, -1, -1,  1, -1, -1, -1,  1,  1, },
{ -1, -1, -1,  1, -1, -1,  1,  1,  1, -1,  1,  1,  1,  1,  1, },
{ -1, -1, -1,  1, -1, -1, -1,  1,  1, -1, -1, -1, -1, -1, },
{  1,  1, -1,  1, -1, -1, -1, -1, -1, -1,  1, -1, -1,  1,  1, },
{ -1,  1, -1,  1,  1,  1, -1, -1, -1, -1,  1, -1,  1, -1,  1, },
{  1,  1, -1,  1,  1, -1,  1,  1,  1,  1, -1,  1,  1,  1, },
{  1,  1, -1,  1,  1,  1,  1,  1, -1, -1, -1, -1, -1, },
{ -1, -1, -1,  1,  1,  1,  1,  1, -1,  1, -1, -1, -1,  1,  1, },
{  1, -1,  1,  1, -1, -1, -1,  1, -1,  1,  1,  1, -1,  1, -1, },
{ -1,  1,  1,  1, -1, -1, -1,  1, -1,  1,  1, -1,  1, -1,  1, },
{ -1,  1,  1,  1, -1,  1,  1, -1, -1, -1, -1,  1, -1, -1, },
{  1, -1,  1,  1, -1,  1,  1,  1, -1, -1,  1, -1, -1,  1,  1, },
{ -1,  1,  1,  1,  1, -1,  1,  1, -1,  1, -1,  1, -1,  1,  1, },
{  1, -1,  1,  1,  1,  1,  1, -1, -1,  1, -1, -1,  1,  1, },
{  1,  1,  1,  1, -1,  1, -1,  1, -1, -1, -1, -1,  1, -1, },
{ -1,  1,  1,  1, -1,  1, -1,  1, -1,  1, -1,  1,  1,  1,  1, },
{  1, -1,  1,  1, -1, -1,  1,  1,  1, -1, -1,  1,  1,  1,  1, },
{ -1,  1,  1,  1, -1, -1,  1, -1,  1, -1, -1, -1, -1, -1, },
{  1, -1,  1, -1,  1, -1, -1,  1,  1, -1, -1, -1,  1, -1,  1, },
{  1,  1,  1, -1,  1, -1, -1,  1,  1,  1,  1, -1,  1, -1, },
{ -1, -1, -1,  1,  1,  1,  1,  1, -1,  1,  1, -1, -1,  1, -1, },
{  1,  1,  1,  1,  1, -1, -1, -1,  1,  1, -1, -1, -1, -1,  1, },
{ -1, -1,  1,  1,  1, -1, -1, -1, -1, -1,  1,  1, -1, -1,  1, -1, },
```

APPENDIX B-continued

```
{ -1, -1,  1,  1,  1, -1,  1,    1, -1, -1, -1, -1,  1,  1, -1,  1, },
{  1,  1,  1,  1,  1, -1,  1,    1,  1,  1,  1,  1,  1,  1,  1, -1, },
{ -1, -1,  1,  1, -1,  1,  1,    1,  1,  1,  1,  1, -1, -1, -1,  1, },
{  1,  1,  1,  1, -1,  1,  1,    1, -1, -1, -1, -1, -1, -1,  1, -1, },
{  1,  1,  1,  1, -1,  1, -1,   -1, -1, -1,  1,  1,  1,  1, -1,  1, },
{ -1, -1,  1,  1, -1,  1, -1,   -1,  1,  1, -1, -1,  1,  1,  1, -1, },
{  1, -1, -1,  1, -1, -1,  1,   -1,  1, -1, -1,  1,  1, -1, -1, -1, },
{ -1,  1, -1,  1, -1, -1,  1,   -1, -1,  1,  1, -1,  1, -1,  1,  1, },
{ -1,  1, -1,  1, -1, -1, -1,    1, -1,  1, -1,  1, -1,  1, -1, -1, },
{  1, -1, -1,  1, -1, -1, -1,    1,  1, -1,  1, -1, -1,  1,  1,  1, },
{ -1,  1, -1,  1,  1,  1, -1,    1,  1, -1,  1, -1,  1, -1, -1, -1, },
{  1, -1, -1,  1,  1,  1, -1,    1, -1,  1, -1,  1,  1, -1,  1,  1, },
{  1, -1, -1,  1,  1,  1,  1,   -1, -1,  1, -1,  1, -1,  1, -1, -1, },
{ -1,  1, -1,  1,  1,  1,  1,   -1,  1, -1,  1,  1, -1,  1,  1,  1, },
```

APPENDIX C

```
-1  1   1  1  1   1  1  -1  -1  1  -1   1  1   1  1  1
-1  1  -1 -1  1  -1  1   1  -1 -1   1   1  1   1  1  1
-1  1  -1  1  1  -1 -1   1  -1  1  -1  -1  1  -1  1  1
-1  1   1  1  1   1 -1   1  -1 -1   1   1  1  -1  1 -1
-1  1   1 -1  1   1 -1   1  -1  1  -1  -1 -1  -1  1  1
-1  1  -1  1  1  -1  1  -1  -1 -1   1  -1 -1  -1  1  1
-1  1  -1 -1  1  -1  1  -1  -1  1  -1   1 -1   1  1  1
-1  1   1 -1  1   1  1  -1  -1 -1   1  -1 -1   1  1 -1
```

Figure 12:
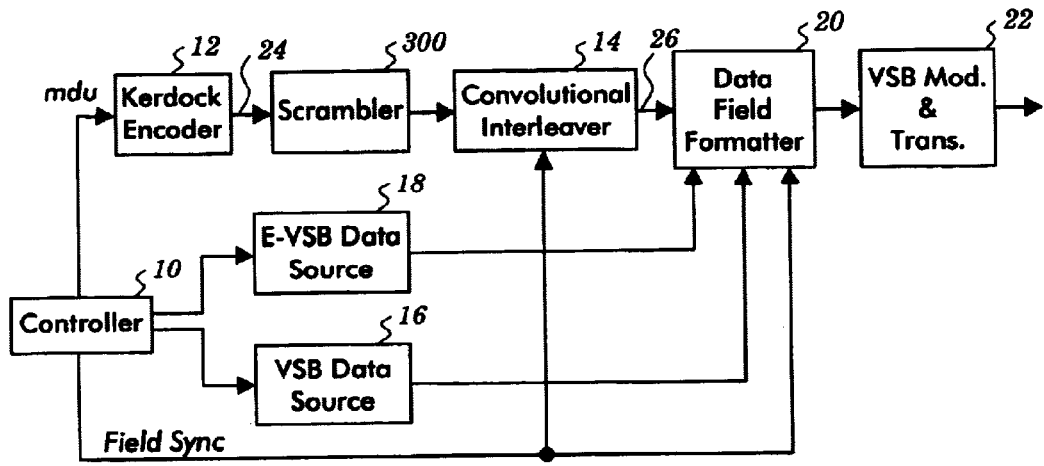
FIGS. 12 and 13 are corresponding schematic diagrams of an alternative map insertion system and an alternative receiver that permit maps to be detected even in the presence of short static ghosts.

The arrangement disclosed in FIG. 2 is modified as shown in FIG. 12 in order to permit maps to be more easily detected in the presence of short static ghosts. Except for an additional component, the arrangements shown in FIGS. 2 and 12 are the same and, therefore, FIGS. 2 and 12 use the same reference numbers to depict the same components. The arrangement of FIG. 12, however, also includes a scrambler 300 that scrambles the bits in the duplicate map while not scrambling the bits in the original map.

As shown in FIG. 12, the scrambler 300 operates on the output of the Kerdock encoder 12 and supplies its output to the convolutional interleaver 14. Because the scrambler 300 does not scramble the first occurrence of the map, the forty eight bits of the map $\{A_0\ B_0\ P_1\}$, $\{C_0\ A_e\ P_2\}$, $\{B_e\ C_e\ P_3\}$ from the Kerdock encoder 12 pass through the scrambler 300 in the sequence in which they leave the Kerdock encoder 12. However, because the scrambler 300 scrambles the duplicate of the map, the forty eight bits of the duplicate map $\{A_0\ B_0\ P_1\}$, $\{C_0\ A_e\ P_2\}$, $\{B_e\ C_e\ P_3\}$ from the Kerdock encoder 12 exit the scrambler 300 in a sequence that is different from the sequence that leaves the Kerdock encoder 12.

As indicated above, the Kerdock encoder 12 encodes the maps in groups of two map data sub-units (four bits per map data sub-unit) to produce sixteen output bits per group. These sixteen bits comprise eight bits of the corresponding two map sub-units and eight parity bits. These sixteen bits in sequence may be arbitrarily designated as 1 2 3 4 5 6 7 8 9 10 11 12 13 14 15 16. Therefore, the first occurrence of the first sixteen bits of a map exits the scrambler 300 in this sequence. However, the second occurrence of these first sixteen bits (i.e., the first sixteen bits of the duplicate map) exits the scrambler 300 in a scrambled sequence. For example, these sixteen bits may exit the scrambler 300 in the following sequence: 13 9 5 1 14 10 6 2 15 11 7 3 16 12 8 4. Accordingly, the first bit in the original map is the fourth bit in the duplicate map, the second bit in the original map is the eighth bit in the duplicate map, and so on. Other alternative scrambling sequences could be used.

Likewise, the first occurrence of the second sixteen bits of the map exits the scrambler 300 in the unscrambled sequence, and the second occurrence of these second sixteen bits (i.e., the second sixteen bits of the duplicate map) exits the scrambler 300 in the scrambled sequence of 13 9 5 1 14 10 6 2 15 11 7 3 16 12 8 4. Similarly, the first occurrence of the third sixteen bits of the map exits the scrambler 300 in the unscrambled sequence, and the second occurrence of these third sixteen bits (i.e., the third sixteen bits of the duplicate map) exits the scrambler 300 in the scrambled sequence of 13 9 5 1 14 10 6 2 15 11 7 3 16 12 8 4.

Therefore, because the original map is not scrambled and the duplicate map is scrambled, the likelihood, in the case of a short static ghost, that the original map and the duplicate map will be superimposed on the same frame sync bits is materially reduced making recovery of the map from the average of the original and duplicate maps much more likely.

Figure 13:
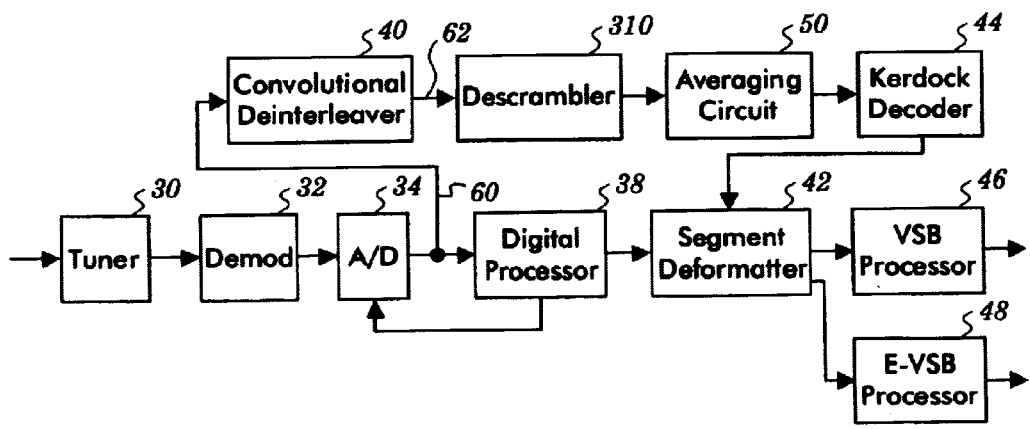

The arrangement disclosed in FIG. 4 is likewise modified as shown in FIG. 13 in order to permit the maps to be more easily detected in the presence of short static ghosts. Except for an additional component, the arrangements shown in FIGS. 4 and 13 are the same and, therefore, FIGS. 4 and 13 use the same reference numbers to depict the same components. The arrangement of FIG. 13, however, also includes a de-scrambler 310 that is provided between the convolutional de-interleaver 40 and the averaging circuit 50. The de-scrambler 310 reverses the process of the scrambler 300. Accordingly, the de-scrambler 310 passes the original map bits without de-scrambling and de-scrambles the bits of the duplicate map to reverse the scrambling of the duplicate map imposed by the scrambler 300.

In order to support effective map recovery in the receiver in the presence of burst noise or repeated bursts of noise, a twelve bit map data unit (mdu) is still defined. However, of these twelve bits, ten bits are used to define a map and the remaining two bits form half of a four bit frame count. A first mdu, which may be designated as $mdu_0$, is denoted as $\{A_0\ B_0\ C_0\}$. This mdu comprises ten bits to define a current map and two of the bits of the four bit frame count. The two frame count bits and the ten bits defining the current map may be distributed in any desired fashion in $mdu_0$. A second mdu, which may be designated as $mdu_e$, is denoted as $\{A_e\ B_e\ C_e\}$. This mdu comprises ten bits to define a next map and the remaining two of the bits of the four bit frame count. As before, the remaining two frame count bits and the ten bits defining the next map may be distributed in any desired fashion in $mdu_e$.

The current map is the map that the receiver uses in determining the location of data in the field of a frame that it is currently receiving, the next map is the map that the receiver will use in determining the location of data in the fields of a future frame, and the frame count indicates the number of frames that the receiver will have to receive before it starts using the next map to determine the location of data in the fields of the future frame. As each field of each frame prior to the future frame is transmitted, the current map and the next map stay the same. However, the frame count is decremented as each of these frames is transmitted. As is known in the art, a frame consists of two fields.

For example, it may be assumed that frame 0 is a first frame to which $MAP_a$ is to be applied as the current map. The transmitter inserts $MAP_a$ into both fields of frame −1, i.e., the frame that is transmitted prior to frame 0. The transmitter also inserts $MAP_b$, which defines the next map, and the frame count 0 into frame −1. Thus, the current map leads the first frame to which it is to be applied by one frame. The receiver recovers $MAP_a$, $MAP_b$, and the frame count 0 from frame −1, and stores the recovered $MAP_a$, $MAP_b$, and the frame count of 0 in a memory. However, the receiver uses a previously received current map to find data in the frame −1.

In preparing frame 0 for transmission, the transmitter inserts into frame 0 the same maps that it inserted into frame −1, i.e., $MAP_a$ and $MAP_b$. However, the frame count that the transmitter inserts into frame 0 is now k. The receiver stores $MAP_a$, and $MAP_b$, and the frame count k that it receives in frame 0. The receiver uses $MAP_a$ to locate data in frame 0.

This process continues such that $MAP_a$ and $MAP_b$ are transmitted in each of the following frames 1, 2, . . . , k−1. The frame count is decremented in each of these frames. When frame k is transmitted, frame k now contains $MAP_b$ as the current map, a new map $MAP_c$ as the next map, and a frame count of 0. Below is a table containing a simplified example of the above operation where k=5.

| Frame # | Frame count | Map data |
|---|---|---|
| . | . | . |
| . | . | . |
| . | . | . |
| −1 | 0 | Current map = map (a, 10) |
|  |  | next map = map (b, 6) |
| 0 | 5 | Current map = map (a, 1) |
|  |  | next map = map (b, 6) |
| 1 | 4 | Current map = map (a, 2) |
|  |  | next map = map (b, 6) |
| 2 | 3 | Current map = map (a, 3) |
|  |  | next map = map (b, 6) |
| 3 | 2 | Current map = map (a, 4) |
|  |  | next map = map (b, 6) |
| 4 | 1 | Current map = map (a, 5) |
|  |  | next map = map (b, 6) |
| 5 | 0 | Current map = map (b, 6) |
|  |  | next map = map (c, 12) |
| 6 | 5 | Current map = map (b, 7) |
|  |  | next map = map (c, 12) |
| 7 | 4 | Current map = map (b, 8) |
|  |  | next map = map (c, 12) |
| 8 | 3 | Current map = map (b, 9) |
|  |  | next map = map (c, 12) |
| 9 | 2 | Current map = map (b, 10) |
|  |  | next map = map (c, 12) |
| . | . | . |
| . | . | . |
| . | . | . |

The frame count is decremented modulo k+1=5. The map changes every k+1 frames. The notation "map (x,y)" refers to a specific map x that will apply to frame #y. As discussed above, the current map leads the to which it is to be applied by one frame. The leading is reflected in the map data of the Table. If the location of VSB data and E-VSB data does not change frame k−1 to frame k, the current map and the next map simply remain the same.

As indicated above, the receiver maintains its own frame count in its memory and also saves the current map and the next map in the memory. As each frame (comprising two fields) is received, the receiver either stores the frame count in that frame in the memory or decrements the stored frame count by one, as discussed more fully below. Thus, the part of the memory that stores the frame counter may be referred to herein as a count down counter. Therefore, if the portion of one or more fields containing the map and frame count information cannot be properly received because of noise in the channel, the receiver can determine from its own count down counter when to begin using the next map that it has stored in memory.

The transmitter can insert the current map, the next map, and the frame count into any desired segment of a field. Preferably, the transmitter is arranged to insert the current map, the next map, and the frame count into the reserved portion of the field sync segment of a field. Moreover, the transmitter may be arranged to scramble the current map, the next map, and the frame count in the even fields but not in the odd fields. For example, the current map, the next map, and the frame count in the odd field, which is defined as the field having the positive middle PN63 sequence in its field sync segment, are not scrambled. On the other hand, the current map, the next map, and the frame count in the even field, which is defined as the field having the negative middle PN63 sequence in its field sync segment, are scrambled. The transmitter can use the scrambling sequences disclosed above for this scrambling. Also, because the same map and count information are transmitted in the odd and even fields of a frame, this information can be averaged in the receiver as discussed above.

Figure 14:
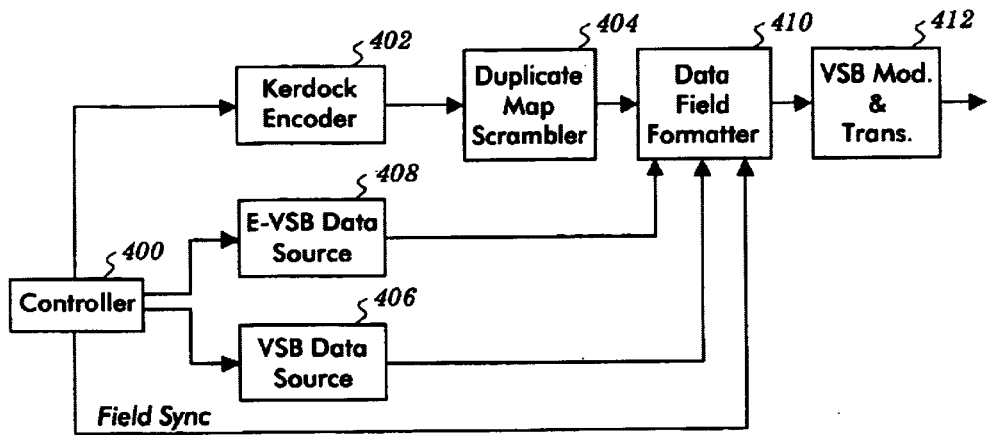
FIGS. 14 and 15 are corresponding schematic diagrams of another alternative map insertion system and another alternative receiver that permit maps to be detected.

As shown in FIG. 14, a controller 400 generates a sequence of map data units for application to a Kerdock encoder 402. Eight bits at a time are supplied to the Kerdock encoder 402. Thus, the first eight bits supplied to the Kerdock encoder 402 correspond to map data sub-units $A_0\ B_0$, the next eight bits supplied to the Kerdock encoder 402 correspond to map data sub-units $C_0\ A_e$, and the next eight bits supplied to the Kerdock encoder 402 correspond to map data sub-units $B_e\ C_e$. The map data units for succeeding fields are applied to the Kerdock encoder 402 in a like fashion.

For each eight bit input, the Kerdock encoder 402 produces a sixteen bit code word or vector that consists of the eight input bits and eight parity bits $P_x$. Accordingly, for input map data sub-units $A_0\ B_0$, the output of the Kerdock encoder 12 is a code word or vector $\{A_0\ B_0\ P_1\}$; for map data sub-units $C_0\ A_e$, the output of the Kerdock encoder 12 is $\{C_0\ A_e\ P_2\}$; and, for map data sub-units $B_e\ C_e$, the output of the Kerdock encoder 12 is $\{B_e\ C_e\ P_3\}$. Thus, three map data sub-units covering the current map, the next map, and the frame count are thereby encoded as three sixteen bit output vectors containing forty-eight bits in all. For these purposes, the Kerdock encoder 402 may use any of the Kerdock encoding techniques described above in connection with FIGS. 6 and 7 or other Kerdock encoding technique.

As shown in FIG. 14, a scrambler 404 operates on the output of the Kerdock encoder 402 and supplies its output to a data field formatter 20. The scrambler 404 scrambles the current map, the next map and the frame count that are inserted in the even field of a frame, and does not scramble the current map, the next map and the frame count that are inserted in the odd field of that frame. Because the scrambler 404 does not scramble the map and frame count data inserted into the odd field, the forty eight bits, i.e., $\{A_0\ B_0\ P_1\}$, $\{C_0\ A_e\ P_2\}$, and $\{B_e\ C_e\ P_3\}$, from the Kerdock encoder 402 corresponding to the map and frame count data for the odd field pass through the scrambler 404 in the sequence in which they leave the Kerdock encoder 402. However, because the scrambler 404 does scramble the map and frame count data inserted into the even field, the forty eight bits, i.e., $\{A_0\ B_0\ P_1\}$, $\{C_0\ A_e\ P_2\}$, and $\{B_e\ C_e\ P_3\}$ from the Kerdock encoder 402 corresponding to the map and frame count data for the even field exit the scrambler 404 in a sequence that is different from the sequence that leaves the Kerdock encoder 402. The scrambler 404 may use the scrambling sequence disclosed above.

A VSB data source 406 provides VSB data, and an E-VSB data source 408 provides E-VSB data. The controller 400 controls the VSB data source 406 and the E-VSB data source 408 so as to control the mix of VSB and E-VSB data segments in a field according to its corresponding current map. The data segments supplied by the VSB data source 406 and the E-VSB data source 408, together with the encoded (and possibly scrambled) map and frame count data from the scrambler 404, are applied to a data field formatter 410. The data field formatter 410 is synchronized to the field sync signal from the controller 400 and formats the transmitted field so that the forty-eight encoded (and possibly scrambled) map and frame count bits are inserted into the reserved portion of a field sync segment as described above. Thus, the VSB data source 406 and the E-VSB data source 408 are controlled by the controller 400 so that the VSB and E-VSB data segments supplied by the VSB data source 406 and the E-VSB data source 408 to the data field formatter 410 correspond to the current map of the map and frame count data from the scrambler 404. The data field formatter 410 is synchronized so that these VSB and E-VSB data segments are appropriately multiplexed throughout the current field in accordance with the current map contained in the same field.

Finally, the formatted fields are successively applied to a standard ATSC modulator and transmitter 412 for transmission.

Figure 15:
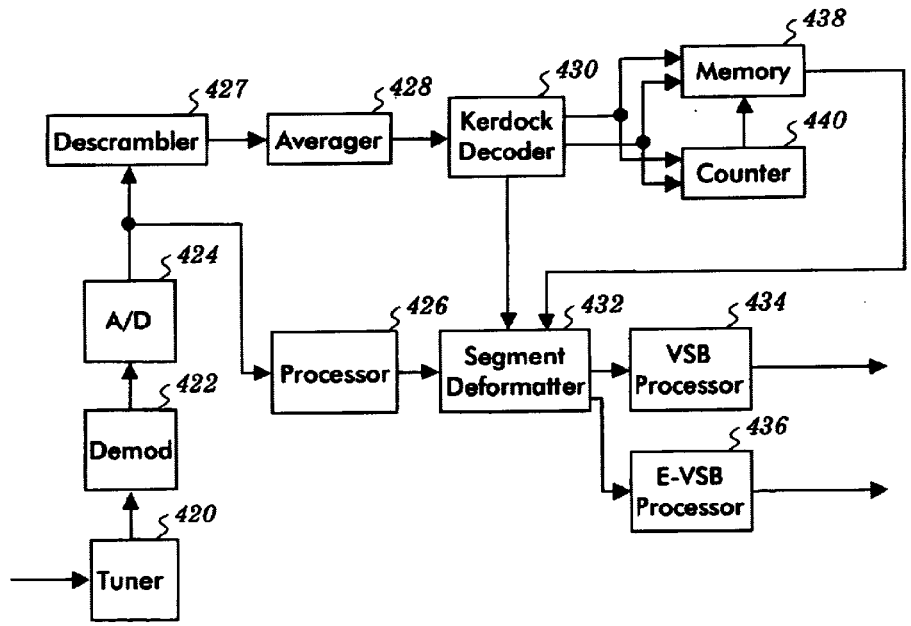

As shown in FIG. 15, the signal transmitted by the ATSC modulator and transmitter 412 is received by a receiver comprising a tuner 420. The IF output of the tuner 420 is demodulated by an ATSC demodulator 422 in order to provide an analog baseband output representing the transmitted symbols. This analog signal is sampled by an A/D converter 424 under control of a digital processor 426 to convert the demodulated symbols into corresponding multi-bit digital values. The encoded map and frame count data contained in the field just received are applied to a descrambler 427 that reverses the scrambling imposed by the scrambler 404. The encoded map and frame count data contained in the field just received are then applied to an averager 428 that, as discussed above, averages the encoded map and frame count data contained in two fields of the same frame. The averaged and encoded map and frame count data are then applied to a Kerdock decoder 430 for decoding. The Kerdock decoder 430 may use any of the Kerdock decoding techniques described above in connection with FIGS. 8 and 9 or other suitable Kerdock decoding technique. As discussed above, the encoded map and frame count data includes the current map, the next map, and the frame count discussed above.

The Kerdock decoder 430 applies the decoded current map and the decoded next map to a memory 438. The current map that is stored in the memory 438 and that applies to the field being received is supplied to a segment de-formatter 432. The segment de-formatter 432 responds to this current map by passing the VSB segments in the field being received to a VSB processor 434 and by passing the E-VSB segments in the field being received to an E-VSB processor 436. The VSB processor 434 and the E-VSB processor 436 decode and otherwise process the respective VSB data and E-VSB data from the segment de-formatter 432.

Moreover, the Kerdock decoder 430 applies the decoded frame count from the field being received to a count down counter 440. As suggested above, the counter down counter 440 may be part of the memory 438. Additionally, the Kerdock decoder 430 applies the reliability factor discussed above to the memory 438 and to the count down counter 440.

If the reliability factor indicates that the map and frame count information contained in the field being received is reliable, the received frame count is stored in the count down counter 440, and the current map and the next map are also stored as discussed above. On the other hand, if the reliability factor indicates that the map and frame count information contained in the field being received is not reliable because, for example, the field being received has been corrupted by noise, two actions are taken. First, the count in the count down counter 440 is decremented modulo k (once per frame) based on frame sync signal timing. Second, the old current map and the old next map are retained in the memory 438, unless the counter down counter 440 is decremented to zero. In that case, the current map, which is stored in the memory 438 and which is to be applied to the next received frame, is set to the stored next map, and the next map is left as is.

In this way, the count down counter 440 can. keep track of when the next map stored in the memory 438 should be used as the current map. Thus, if the map and the frame count information is not properly received in one or more fields around the transition from current map use to next map use, the receiver, prompted by the count down counter 440, can simply use the next map that is stored in the memory 438. In the example of table above, if the map and frame count information are not adequately received in the fields of frames 4 and 5, the receiver can simply use map (b,6) that is stored in the memory 438 to locate the various data in the fields of frame 6.

In this way, the present invention is able to withstand burst noise without the use of interleaving and de-interleaving. Moreover, the present invention is able to withstand repeated bursts of noise.

As described above, an unscrambled version of the current map, the next map, and the frame count k are inserted into the odd field of a frame, and the scrambled version of the same current map, the same next map, and the same frame count k are inserted into the even field of the same frame. Then, an unscrambled version of the same current map, the same next map, and the frame count k−1 are inserted into the odd field of the next frame, and the scrambled version of the same current map, the same next map, and the same frame count k−1 are inserted into the even field of the same next frame. For each field, the map and count information is encoded by the Kerdock encoder 402 prior to supply to the scrambler 404. The Kerdock encoder 402, as described above, may be referred to as a 16/8 encoder because it provides a 16 bit encoded output based on an 8 bit input. Similarly, the Kerdock decoder 430, as described above, may be referred to as a 16/8 decoder because it provides an 8 bit decoded output based on a 16 bit input.

Figure 16:
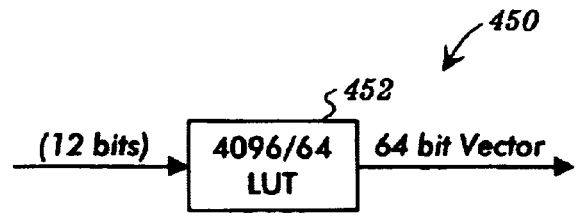
FIG. 16 shows a 64/12 embodiment of a Kerdock encoder that can be used in the map insertion system shown in FIG. 14.

The Kerdock encoder 402 may instead be a 64/12 encoder, and the Kerdock decoder 430 may instead be a 64/12 decoder. Thus, a non-systematic Kerdock encoder 450 in the form of a 64/12 encoder is shown in FIG. 16 and may be used for the Kerdock encoder 402. The non-systematic Kerdock encoder 450 accepts an input having 12 bits, such as the map data sub-units $A_0$, $B_0$, and $C_0$ having a total of twelve bits, and outputs a corresponding code word having 64 bits by reading out an appropriate 64 bit code word from a look-up table 452.

The look up table 452 stores 4096 Kerdock code vectors each having a length of 64. That is, each of these Kerdock code vectors comprises 64 bits. There are $2^{64}$ different code vectors having a length of 64. However, only $2^{12}$ or 4096 of these $2^{64}$ different code vectors satisfy the requirements for being a Kerdock code vector. These Kerdock vectors are described in "The $Z_4$-linearity of Kerdock, Preparata, Goethals, and Related Codes," by A. Roger Hammons, Jr., P. Vijay Cumar, A. R. Calderbank, N. J. A. Sloane, and Patrick Sole, IEEE Transactions on Information Theory, vol. 40, #2, pp 301–319, March, 1994. Thus, each different combination of the twelve input bits can be used as a unique address into the look up table 452 in order to uniquely select a corresponding one of the 4096 Kerdock code vectors.

When the Kerdock encoder 450 is used as the Kerdock encoder 402 of FIG. 14, the controller 400 supplies two groups of twelve bits per frame to the Kerdock encoder 450. The first group contains the current map and the first two of the four bits that comprise the frame count. The Kerdock encoder 450 uses these twelve bits in the first group as an address into the look up table 452 in order to output a corresponding 64 bit Kerdock Code vector. The date field formatter inserts this 64 bit Kerdock code vector into the odd field of a frame.

The second group contains the next map and the second two of the four bits that comprise the frame count. The Kerdock encoder 450 uses these twelve bits in the second group as an address into the look up table 452 in order to output a corresponding 64 bit Kerdock Code vector. The date field formatter inserts this 64 bit Kerdock code vector into the even field of a frame.

Thus, when a 16/8 Kerdock encoder is used, the current map, the next map, and the entire frame count can be encoded as three 16 bit Kerdock code vectors for insertion into the reserved portion of the field sync segment of a single field. However, when a 64/12 Kerdock encoder is used, the current map, the next map, and the entire frame count are encoded as two 64 bit Kerdock code vectors. Because the reserved portion of the field sync segment of a single field contains insufficient space to hold both of these Kerdock code vectors, the first of these Kerdock code vectors (representing the current map and the first two frame count bits) is inserted into the odd field of a frame, and the second of these Kerdock code vectors (representing the next map and the second two frame count bits) is inserted into the even field of the frame.

Therefore unlike the 16/8 Kerdock encoder case where the current map, the next map, and the frame count are transmitted twice, once in the odd field of a frame and once in the even field of the frame, the current map, the next map, and the frame count are transmitted only once in the case of the 64/12 Kerdock encoder case where both fields of a frame are required to contain this map and frame count information. Accordingly, no portion of the map and frame information is scrambled when a 64/12 Kerdock encoder is used. However, scrambling is not really necessary when two 64 bit Kerdock code vectors are required to transmit the map and frame count information because of the additional robustness obtained by the additional length of the code vectors. Therefore, when the Kerdock encoder 402 is a 64/12 Kerdock encoder, the scrambler 404 may be eliminated.

Also, this additional robustness means that the descrambler 427 and the averager 428 may be eliminated. The descrambler 427 is not necessary when the scrambler 404 is not used. Implementation of the averager 428 becomes more awkward because the map and frame count information is transmitted only once when a 64/12 Kerdock encoder is used. While it might be possible to average only the map information from two succeeding frames because only the frame count typically changes from frame to frame (unless the frame count has expired), the additional robustness obtained from the use of longer Kerdock code vectors makes averaging unnecessary.

Figure 17:
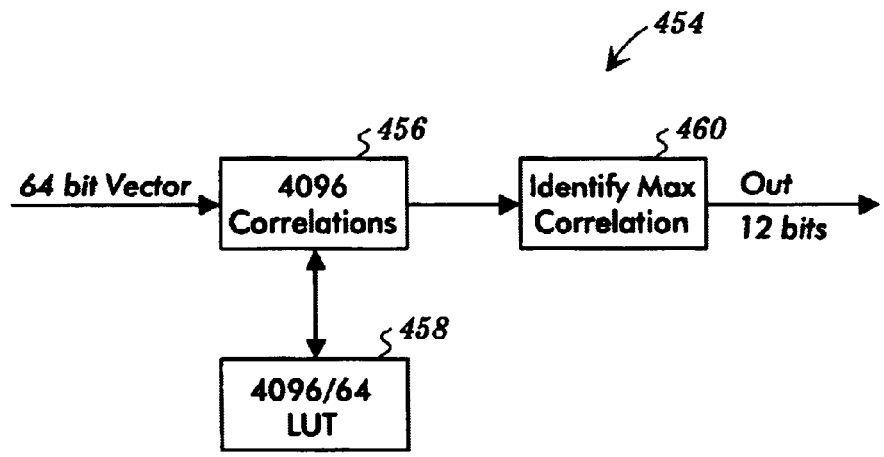
FIG. 17 shows a 64/12 embodiment of a Kerdock decoder that can be used in the receiver portion shown in FIG. 15.

A non-systematic Kerdock decoder 454 is shown in FIG. 17 and may be used for the Kerdock decoder 430. The non-systematic Kerdock decoder 454 accepts an input having 64 bits and outputs a vector of 12 bits that may contain two of the four bits of the frame count in addition to either the current map or the next map.

More specifically, a correlator 456 correlates the 64 input bits with each of 4096 Kerdock code words stored in a look-up table 458. These Kerdock code words may be the same Kerdock code words stored in the look up table 452. The correlation implemented by the correlator 456, for example, may be a dot product of the input 64 bits and each of the Kerdock code words stored in the look-up table 458.

Thus, the first bit of the 64 input bits is multiplied by the first bit of a first Kerdock code word stored in the look-up table 458 to form a first product, the second bit of the 64 input bits is multiplied by the second bit of the first Kerdock code word stored in the look-up table 86 to form a second product, . . . , and the sixty-forth bit of the 64 input bits is multiplied by the sixty-forth bit of the first Kerdock code word stored in the look-up table 86 to form a sixty-forth product. The resulting sixty-four products are added to form a first correlation between the 64 input bits and the first Kerdock code word stored in the look-up table 458. This process is repeated for each of the other 4095 Kerdock code words stored in the look-up table 458.

An identifier 460 identifies the Kerdock code word from the look-up table 458 that produces the largest correlation, and outputs the twelve bits that correspond to this Kerdock code word as the twelve output bits making up either the current and two of the frame count bits or the next map and the other two frame count bits. The identifier 460 may also form the difference between the largest correlation and the next largest correlation as a reliability factor that indicates the reliability with which the 64 input bits have been decoded.

It is possible to given a particular frame count in the transmitted frames a specialized meaning. For example, a frame count of 1111 can be used to indicate to the receiver that the current map and the next map are the same.

In the context of the embodiment described above with respect to FIGS. 16 and 17, a static ghost can make properly receiving and decoding the map information difficult, if not impossible. The embodiment of the invention described below in relation to FIGS. 18 and 19 facilitates the proper receiving and decoding of the map information even in the presence of a static ghost.

Figure 18:
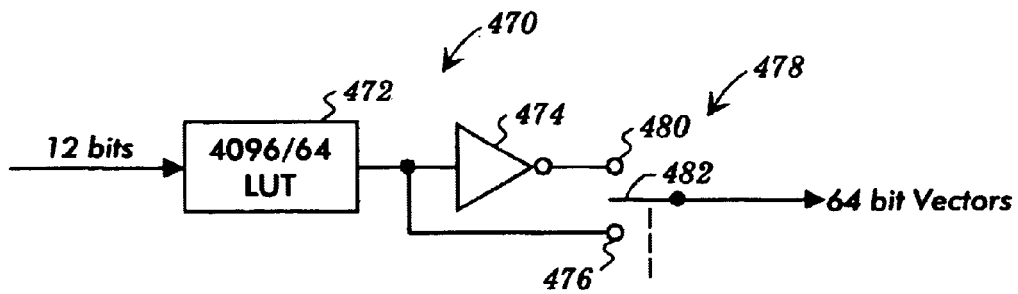
FIG. 18 shows another 64/12 embodiment of a Kerdock encoder that can be used in the map insertion system shown in FIG. 14.

As shown in FIG. 18, a non-systematic Kerdock encoder 470 in the form of a 64/12 encoder may be used for the Kerdock encoder 402. The non-systematic Kerdock encoder 470, as before, accepts an input having 12 bits, such as the map data sub-units $A_0$, $B_0$, and $C_0$ having a total of twelve bits, and outputs a corresponding code word having 64 bits by reading out an appropriate 64 bit code word from a look-up table 472.

Also as before, when the Kerdock encoder 470 is used as the Kerdock encoder 402 of FIG. 14, the controller 400 supplies two groups of twelve bits per frame to the Kerdock encoder 470. The first group contains the current map and the first two of the four bits that comprise the frame count. The Kerdock encoder 470 uses these twelve bits in the first group as an address into the look up table 472 in order to output a corresponding 64 bit Kerdock code vector. The data field formatter inserts this 64 bit Kerdock code vector into the odd field of a frame.

The second group contains the next map and the second two of the four bits that comprise the frame count. The Kerdock encoder 470 uses these twelve bits in the second group as an address into the look up table 472 in order to output a corresponding 64 bit Kerdock code vector. The data field formatter inserts this 64 bit Kerdock code vector into the even field of a frame.

The 64 bit Kerdock code vectors read from the look up table 472 are supplied to an inverter 474 and also to a first contact 476 of a switch 478. The output of the inverter 474 is supplied to a second contact 480 of the switch 478. The switch 478 has a movable contact 482 that is controlled by the controller 400 (see dashed line). When the 64 bit Kerdock code vector that is to be inserted into the odd field of a frame is read out of the look up table 472, the switch 478 is controlled by the controller 400 so that the first contact 476 and the movable contact 482 engage and the inverter 474 is bypassed. Therefore, this 64 bit Kerdock code vector is inserted into the odd field of a frame as a non-inverted 64 bit Kerdock code vector.

However, when the 64 bit Kerdock code vector that is to be inserted into the even field of a frame is read out of the look up table 472, the switch 478 is controlled by the controller 400 so that the second contact 480 and the movable contact 482 engage and the inverter 474 is not bypassed. Therefore, this 64 bit Kerdock code vector is inserted into the even field of a frame as an inverted 64 bit Kerdock code vector. This process continues so that odd field 64 bit Kerdock code vectors are non-inverted and the even field 64 bit Kerdock code vectors are inverted.

Figure 19:
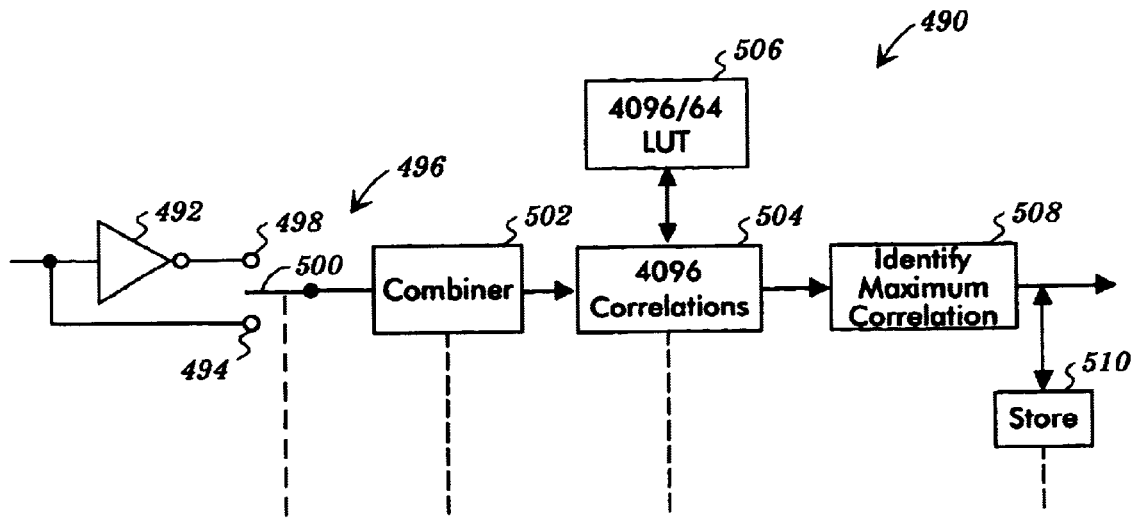
FIG. 19 shows another 64/12 embodiment of a Kerdock decoder that can be used in the receiver portion shown in FIG. 15.

A non-systematic Kerdock decoder 490 is shown in FIG. 19 and may be used for the Kerdock decoder 430. The non-systematic Kerdock decoder 490 accepts an input having 64 bits and outputs a vector of 12 bits that contains two of the four bits of the frame count in addition to ten bits of map information.

More specifically, a received 64 bit Kerdock code vector is provided both to an inverter 492 and to a first contact 494 of a switch 496. The output of the inverter 492 is coupled to a second contact 498 of the switch 496. The switch 496 has a movable contact 500 that is coupled to a combiner 502.

When the 64 bit Kerdock code vector in the odd field of a frame is received, the switch 496 is controlled by the digital processor 38 (see dashed line) so that the first contact 494 and the movable contact 500 engage and the inverter 492 is bypassed. Therefore, this 64 bit Kerdock code vector is passed directly to the combiner 502, which holds this odd field 64 bit Kerdock code vector until the even field 64 bit Kerdock code vector is received. The combiner 502 is controlled by the digital processor 38 (see dashed line).

When the 64 bit Kerdock code vector in the even field of a frame is received, the switch 496 is controlled by the digital processor 38 so that the second contact 498 and the movable contact 500 engage and the inverter 492 is not bypassed. Therefore, this even field 64 bit Kerdock code vector, which had been inverter by the inverter 474 in the transmitter, is re-inverted by the inverter 492 back to its original state.

The combiner 502 performs a bit wise addition of the re-inverted even field 64 bit Kerdock code vector and the odd field 64 bit Kerdock code vector that it previously held. The combiner 502 supplies the combined 64 bit Kerdock vector to a correlator 504. This process continues so that corresponding pairs of odd field 64 bit Kerdock code vectors and re-inverted even field 64 bit Kerdock code vectors are likewise combined into a corresponding combined 64 bit Kerdock code vector that is supplied by the combiner 502 to the correlator 504.

The correlator 504 correlates the combined 64 bit Kerdock code vector from the combiner 502 with each of 4096 Kerdock code words stored in a look-up table 508. These Kerdock code words may be the same Kerdock code words stored in the look up table 472. The correlation implemented by the correlator 504 for example, may be a dot product of the input 64 bits and each of the Kerdock code words stored in the look-up table 506.

In the case where the current map transmitted as the odd field 64 bit Kerdock vector and the next map transmitted as the even field 64 bit Kerdock vector are the same, the correlator 504 produces a single, large peak correlation. An identifier 508 identifies the Kerdock code word from the look-up table 506 that produces this single, large correlation peak, and outputs the twelve bits that correspond to this Kerdock code word as the twelve output bits that make up both the current map and the next map.

In the case where the current map transmitted as the odd field 64 bit Kerdock vector and the next map transmitted as the even field 64 bit Kerdock vector are not the same, the correlator 504 produces two smaller correlation peaks. Because these two smaller but still relatively large correlation peaks result from the correlation process, the digital processor 38 (see dashed line to the correlator 504) can determine that the current map and the next map are not the same. In this event, the digital processor 38 can ignore the correlation result and instead use a map that had previously been stored in a memory 510 (see dashed line).

If a ghost of static data is received at the time both the current map and the next map are received, the ghost received during the current map is not inverted, but the ghost received during the next map is inverted by the inverter 492. Accordingly, when the combiner 502 combines the Kerdock code vectors representing the current map and the inverted next map, the ghosts cancel. In this manner, the map information is properly received and decoded even in the presence of a static ghost.

As indicated above, the E-VSB data contained in some segments of a field may be coded with one robust coding rate and the E-VSB data in other segments of the field may be coded at other robust coding rates. For example, the E-VSB data contained in some segments of a field may be coded by a ½ rate coder and the E-VSB data in other segments of the field may be coded by a ¼ rate coder.

Figure 20:
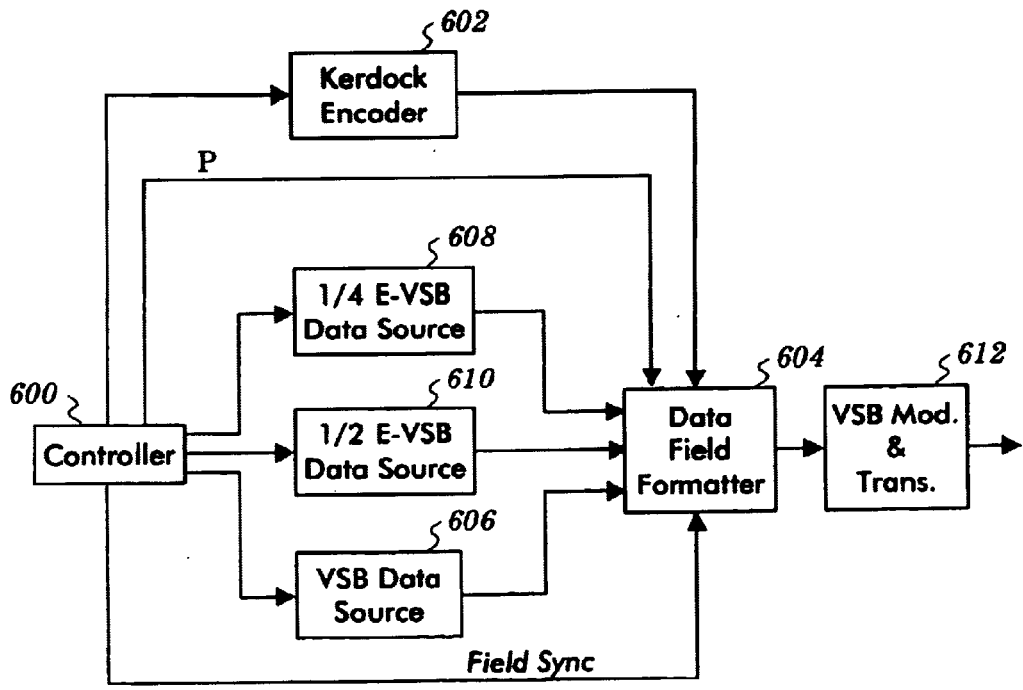
FIGS. 20 and 21 are corresponding schematic diagrams of still another alternative map insertion system and still another alternative receiver that permit maps to be detected; and, FIG. 22 illustrates that the maximum number of segment mixes and locations that can be denoted by a map is less than the number of segment mixes and locations that are possible in a frame containing 312 data segments which can contain any mix of VSB, ¼ rate coded E-VSB, and/or ½ rate coded E-VSB data segments.

FIG. 20 shows a portion of a transmitter that transmits ¼ rate coded E-VSB data, ½ rate coded E-VSB data, and/or VSB data. A controller 600 generates a map for application to a Kerdock encoder 602. The Kerdock encoder 450 may be used for the Kerdock encoder 602, although other Kerdock encoders could be used for the Kerdock encoder 602. Assuming that the Kerdock encoder 450 is used for the Kerdock encoder 602, twelve bits at a time are supplied to the Kerdock encoder 602. Thus, the first twelve bits supplied to the Kerdock encoder 602 correspond to the map $mdu_o$, and the next twelve bits supplied to the Kerdock encoder 602 correspond to the map $mdu_e$. The map $mdu_0$ may be chosen to correspond to the current map symbols, and the map $mdu_e$ may be chosen to correspond to the next map symbols. The maps for succeeding fields are applied to the Kerdock encoder 602 in a like fashion.

For each twelve bit input, the Kerdock encoder 602 produces a sixty-four bit Kerdock code word or vector, and the sixty-four bit Kerdock code word or vector is applied to a data field formatter 604.

In the case where the Kerdock encoder 450 is used for the Kerdock encoder 602, the look up table 452 stores 4096 Kerdock code vectors each having a length of 64. That is, each of these Kerdock code vectors comprises 64 symbols. There are $2^{64}$ different code vectors having a length of 64. However, only $2^{12}$ or 4096 of these $2^{64}$ different code vectors satisfy the requirements for being a Kerdock code vector. These Kerdock code vectors are described in "The $Z_4$-linearity of Kerdock, Preparata, Goethals, and Related Codes," by A. Roger Hammons, Jr., P. Vijay Cumar, A. R. Calderbank, N. J. A. Sloane, and Patrick Sole, IEEE Transactions on Information Theory, vol. 40, #2, pp 301–319, March, 1994. Thus, each different combination of the twelve input symbols can be used as a unique address into the look up table 62 in order to uniquely select a corresponding one of the 4096 Kerdock code vectors.

A VSB data source 606 provides VSB data, an E-VSB data source 608 provides ¼ rate coded E-VSB data coded by a ¼ rate encoder, and an E-VSB data source 610 provides ½ rate coded E-VSB data coded by a ½ rate encoder. The controller 600 controls the VSB data source 606 and the E-VSB data sources 608 and 610 so as to control the mix of VSB, ¼ rate coded E-VSB, and ½ rate coded E-VSB data segments in a field according to its corresponding current map symbols. The data segments supplied by the VSB data source 606 and the E-VSB data sources 608 and 610, together with the encoded map (which includes map symbols and frame count information) from the Kerdock encoder 602, are applied to the data field formatter 604. The data field formatter 604 is synchronized to the field sync signal from the controller 600 and formats the transmitted field so that the sixty-four bits of the encoded map are inserted into the reserved portion of a field sync segment as described above. The VSB data source 606 and the E-VSB data sources 608 and 610 are controlled by the controller 600 so that the VSB data segments, the ¼ rate coded E-VSB data segments, and the ½ rate coded E-VSB data segments supplied by the VSB data source 606 and the E-VSB data sources 608 and 610 to the data field formatter 604 correspond to the current map from the Kerdock encoder 602. The data field formatter 604 is synchronized so that these VSB data segments, ¼ rate coded E-VSB data segments, and ½ rate coded E-VSB data segments are appropriately multiplexed throughout the current field in accordance with the current map contained in the same field. The VSB data segments, ¼ rate coded E-VSB data segments, and ½ rate coded E-VSB data segments may be multiplexed throughout the current field in any desired manner.

Finally, the formatted fields are successively applied to a standard ATSC modulator and transmitter 612 for transmission.

Figure 21:
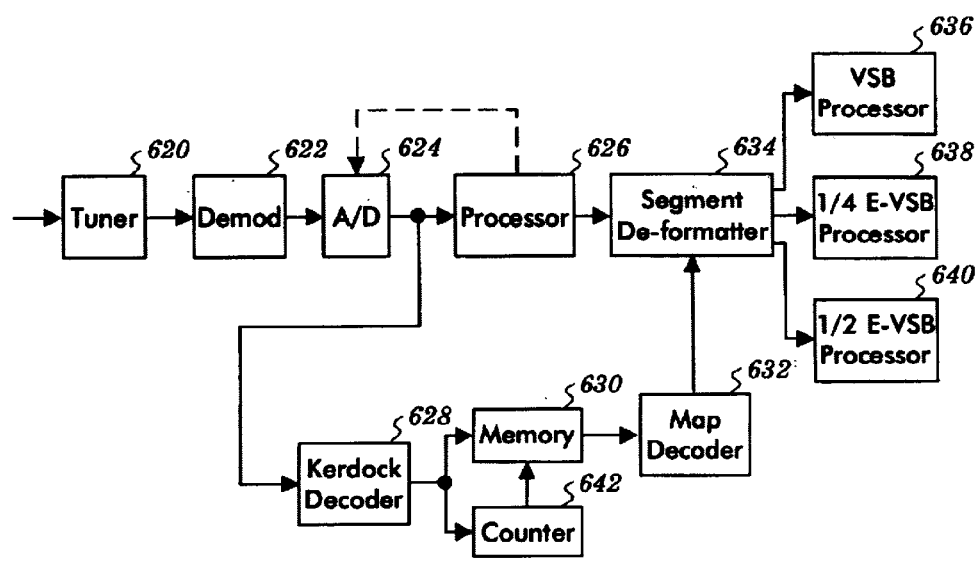

As shown in FIG. 21, the signal transmitted by the ATSC modulator and transmitter 612 is received by a receiver including a tuner 620. The IF output of the tuner 620 is demodulated by an ATSC demodulator 622 in order to provide a baseband analog output representing the transmitted symbols. This analog signal is sampled by an A/D converter 624 under control of a digital processor 626 to convert the demodulated symbols into corresponding multi-bit digital values.

The encoded map at the output of the A/D converter 624 is applied to a Kerdock decoder 628 which recovers the map from the Kerdock code vector described above. If the even field Kerdock code vectors are inverted as discussed above, the Kerdock decoder 628 also re-inverts the inverted Kerdock code vectors. The Kerdock decoder 628 applies the decoded current map or the decoded next map, as appropriate, to a memory 630. The current map that is stored in the memory 630 and that applies to the field being received is supplied to a map decoder 632 that interprets the current map as to the mix and location of the VSB data segments, the ¼ rate coded E-VSB data segments, and the ½ rate coded E-VSB data segments in the current field.

The map decoder 632 decodes the maps using, for example, a look up table which stores mix and location information for each different bit combination for the maps. Alternatively, the map decoder 632 may use other means such as algorithms to determine the mix and locations of the VSB, ¼ rate coded E-VSB, and ½ rate coded E-VSB segments in the current field. The look up table and/or algorithms can be stored in memory.

The mix and location information interpreted by the map decoder 632 is provided to a segment de-formatter 634. The segment de-formatter 634 receives the field from the digital processor 626 and responds to the mix and location information by passing the VSB data segments in the field being received to a VSB processor 636, by passing the ¼ rate coded E-VSB data segments in the field being received to a ¼ rate E-VSB processor 638, and/or by passing the ½ rate coded E-VSB data segments in the field being received to a ½ rate E-VSB processor 640. The VSB processor 636 decodes and otherwise processes the VSB data from the segment de-formatter 634. The ¼ rate E-VSB processor 638 decodes and otherwise processes the ¼ rate coded E-VSB data from the segment de-formatter 634. The ½ rate E-VSB processor 640 decodes and otherwise processes the ½ rate coded E-VSB data from the segment de-formatter 634.

Moreover, the Kerdock decoder 628 applies the frame count contained in the Kerdock decoded map of the field being received to a count down counter 642. The count down counter 642 may be part of the memory 630.

If the map contained in the field being received is not reliable because, for example, the field being received has been corrupted by noise, the count in the count down counter 642 is decremented modulo k (once per frame) based on frame sync signal timing. Also, the old current map and the old next map are retained in the memory 630, unless the counter down counter 642 is decremented to zero. In that case, the current map, which is stored in the memory 630 and which is to be applied to the next received frame, is set to the stored next map, and the next map is left as is.

In this way, the count down counter 642 can keep track of when the next map stored in the memory 630 should be used as the current map. Thus, if the map is not properly received in one or more fields around the transition from current map use to next map use, the receiver, prompted by the count down counter 642, can simply use the next map that is stored in the memory 630. In the example of the table above, if the map and frame count information are not adequately received in the fields of frames 4 and 5, the receiver can simply use map (b,6) that is stored in the memory 44 to locate the various data in the fields of frame 6.

The Kerdock decoder 454 may be used for the Kerdock decoder 628, although other Kerdock decoders could be used for the Kerdock decoder 628. Assuming that the Kerdock decoder 454 is used for the Kerdock decoder 628, the Kerdock decoder 628 accepts an input having 64 symbols and outputs a vector of 12 symbols that contains the corresponding map having two of the four symbols of the frame count in addition to the map data. The 4096 Kerdock code vectors stored in the look-up table 458 may be the same Kerdock code vectors stored in the look up table of the Kerdock encoder 602.

As indicated above, there are a limited number of bits used in the maps to denote segment mixes and locations. Therefore, as should be evident from the above description, the maximum number of segment mixes and locations that can be denoted by this limited number of bits is less than the number of segment mixes and locations that are possible in a frame containing 312 data segments which can contain any mix of VSB, ¼ rate coded E-VSB, and/or ½ rate coded E-VSB data segments.

This characteristic of the map is illustrated in FIG. 22. FIG. 22 shows a chart having both legal and illegal mixes of ¼ rate coded E-VSB data segments and/or ½ rate coded E-VSB data segments in a data field having 312 data segments. (In addition, a field has a frame sync segment for a total of 313 segments.) The numbers above the horizontal line (x axis) in FIG. 22 denote numbers of ¼ rate coded E-VSB data segments. These ¼ rate coded E-VSB data segments change in steps of four because a segment of data is encoded by the ¼ rate encoder as four segments. The numbers to the left of the vertical line (y axis) in FIG. 22 denote numbers of ½ rate coded E-VSB data segments. These ½ rate coded E-VSB data segments change in steps of two because a segment of data is encoded by the ½ rate encoder as two segments. As an example, a field having four ¼ rate coded E-VSB data segments and eight ½ rate coded E-VSB data segments has a total of twelve E-VSB data segments. The remaining segments (312−12=300) of the field are VSB segments. There are 12,403 legal and illegal mixes shown in FIG. 22.

The illegal mixes in FIG. 22 comprise two groups. The first group contains all mixes in which the ¼ rate coded E-VSB data segments and ½ rate coded E-VSB data segments add to a number greater than 312. For example, the second number (314) in the last column of FIG. 22 denotes an illegal mix because there cannot be more than 312 data segments in a field. There are 6,162 mixes in this group. When these mixes are discarded because they cannot be used, the number of mixes remaining is 6,241 (12,403−6, 162=6,241).

If all of the ten map symbols in a map are used to denote mixes of ¼ rate coded E-VSB data segments and ½ rate coded E-VSB data segments in a field, a maximum of only 1,024 mixes can be denoted. Therefore, 5,217 of the remaining 6,241 cannot be used as a practical matter. Accordingly, the second group has 5,217 illegal mixes. Once these illegal mixes are removed, there are only 1,024 legal mixes. The legal mixes can be selected for use on any desired basis.

If only nine of the ten map symbols in a map are used to denote mixes of ¼ rate coded E-VSB data segments and ½ rate coded E-VSB data segments in a field, a maximum of only 512 mixes can be denoted. Therefore, 5,729 of the remaining 6,241 mixes cannot be used as a practical matter. Accordingly, the second group has 5,729 illegal mixes. Once these mixes are removed, there are only 512 legal mixes. Again, the legal mixes can be selected for use on any desired basis.

As discussed above, the map decoder 632 decodes the maps using, for example, a look up table which stores mixes for each different bit combination for the maps. The legal mixes as discussed above in connection with FIG. 22 may be stored in this table and may be addressed by the map. Accordingly, the map is used to address the look up table so as to select a corresponding one of the legal mixes stored therein. The distribution of the selected legal mix of segments can be determined from further map and/or stored information.

In at least some instances, it is desirable to distribute the legal mix of E-VSB segments uniformly throughout the field so as to improve receiver performance relative to packet jitter. One way to distribute the legal mix of E-VSB segments is to use an algorithm. The algorithm may be stored in both the transmitter and receiver as the stored information referred to above.

Prior "uniform distribution" algorithms allow acceptable performance for most receivers at many selected E-VSB data rates. However, some E-VSB data rates are still problematic because these prior algorithms result in areas of the field where the distributed E-VSB segments and/or VSB segments are clumped rather than being uniform. That is, the prior algorithms allocate E-VSB segments at an integer related spacing for a majority of the E-VSB segments to be distributed throughout the field, and the remaining E-VSB data are then inserted into the field to fill in some of the remaining segments starting with the top of the field. The result is that the segments available for the VSB data get pushed toward higher segment numbers (the bottom of the field), thereby increasing packet jitter.

To solve this problem, the algorithm described below uses uniform fractional spacing as a starting point. By rounding down to the integer portion of the fractional spacing, an improved uniform distribution of E-VSB and VSB segments is achieved.

The new algorithm is given as follows:

$$m = 156/P$$

$$s = Int(k*m), \text{ for } k=0, \ldots, (2*P-1)$$

where P is the number of E-VSB segments to be distributed throughout a field divided by two, (i.e., [# of E-VSB segments]/2), s represents the segment numbers (there are 312 data segments in a field numbered 0 through 311), Int means integer and is a rounding down function, and k varies from 0 to 2*P−1.

The table below is an example of the distribution of thirty E-VSB segments throughout a field. In this example, P is fifteen (i.e., 30/2), m is 10.4 (i.e., 156/15), k varies from 0 to 29 (i.e., 2*P−1=29), and s is the segment number. Thus, the first E-VSB segment is segment 0 of the field, the second E-VSB segment is segment 10 of the field, the third E-VSB segment is segment 20 of the field, and so on. VSB data is inserted into the remaining segments. Thus, VSB data is inserted into segments 1–9, 11–19, 21–30, and so on.

| P | m | k | S |
|---|---|---|---|
| 15 | 10.4 | 0 | 0 |
| 15 | 10.4 | 1 | 10 |
| 15 | 10.4 | 2 | 20 |
| 15 | 10.4 | 3 | 31 |
| 15 | 10.4 | 4 | 41 |
| 15 | 10.4 | 5 | 52 |
| 15 | 10.4 | 6 | 62 |
| 15 | 10.4 | 7 | 72 |
| 15 | 10.4 | 8 | 83 |
| 15 | 10.4 | 9 | 93 |
| 15 | 10.4 | 10 | 104 |
| 15 | 10.4 | 11 | 114 |
| 15 | 10.4 | 12 | 124 |
| 15 | 10.4 | 13 | 135 |
| 15 | 10.4 | 14 | 145 |
| 15 | 10.4 | 15 | 156 |
| 15 | 10.4 | 16 | 166 |
| 15 | 10.4 | 17 | 176 |
| 15 | 10.4 | 18 | 187 |
| 15 | 10.4 | 19 | 197 |
| 15 | 10.4 | 20 | 208 |
| 15 | 10.4 | 21 | 218 |
| 15 | 10.4 | 22 | 228 |
| 15 | 10.4 | 23 | 239 |
| 15 | 10.4 | 24 | 249 |
| 15 | 10.4 | 25 | 260 |
| 15 | 10.4 | 26 | 270 |
| 15 | 10.4 | 27 | 280 |
| 15 | 10.4 | 28 | 291 |
| 15 | 10.4 | 29 | 301 |

It may be observed that the above algorithm produces substantially uniform spacing between the E-VSB segments, and that this spacing is confined to only two numbers, x and x+1, where x is dependent on the number of E-VSB segments to be distributed. In the above example where thirty E-VSB segments are distributed accordingly to this algorithm, x is ten such that the spacing between some E-VSB segments is ten and the spacing between the remaining E-VSB segments is eleven.

As an example, the ¼ rate and ½ rate E-VSB segments may be alternated within the E-VSB segments determined by the above algorithm.

This algorithm provides improved uniformity in the spacing of E-VSB and VSB segments throughout a field and thus less jitter in the received signal.

The above algorithm may be implemented in hardware or software. However, it is noted that implementation of the above algorithm requires manipulation of fractional numbers in hardware, which is computationally intensive. Accordingly, a modification to the above algorithm, which requires no fractional computations and which is thus easier to implement in hardware, is given as follows:

$$s = Int(k*156/P) \text{ for } k=0 \text{ to } k=(2*P-1).$$

By performing the multiplication k*156 first and the division by P second, the modified algorithm does not require any multiplications or divisions involving fractional numbers and, therefore, simplifies hardware implementation.

The peak jitter in the main (i.e., VSB segments) stream resulting from the use of the above algorithms is always below two packets (less than 376 bytes).

In the transmitter, the algorithm may be implemented as part of the data field formatter 604. The controller 600 supplies P to the data field formatter 604 as shown in FIG. 20. Alternatively, the controller 600 instead may supply the number of E-VSB segments and the data field formatter 604 can then compute P by dividing the number of E-VSB segments received from the controller 600 by two. The data field formatter 604 performs the algorithm based on P to determine the segments into which the E-VSB data supplied by the E-VSB data sources 608 and 610 is to be inserted.

In the receiver, the map decoder 632 also performs the algorithm to determine the segment numbers of the segments containing E-VSB data. In order to perform the algorithm, the map decoder 632 reads the number of E-VSB segments in the field from the map stored in the memory 630 and determines P from this number as indicated above. The segment numbers determined by the map decoder 632 are provided to the segment de-formatter 634. The segment de-formatter 634 then functions as described above.

Certain modifications of the present invention have been discussed above. Other modifications will occur to those practicing in the art of the present invention. For example, the blocks that have been described above in relation to the various drawing figures described herein may be hardware blocks, software modules, logic arrays, etc. Moreover, the arrangements shown in these drawing figures may be implemented as separate blocks as shown, or the blocks may be combined or divided as desired without departing from the scope of the invention.

Also, as disclosed above, the convolutional interleaver 14 and de-interleaver 40 are preferably characterized by the parameters N=48, B=16 and M=3. However, the convolutional interleaver 14 and de-interleaver 40 may be characterized by other values for the parameters N, B, and M.

As described above, the map as originally transmitted is not scrambled and the duplicate of the map is scrambled. Instead, the map as originally transmitted may be scrambled, in which case the duplicate of the map is not scrambled. Moreover, it is possible to scramble both the map and its duplicate according to different scrambling sequences.

Moreover, the map and its duplicate can be combined in ways other than averaging. For example, the map and its duplicate may simply be added. Alternatively, if a receiver has a ghost detector, then the map and its duplicate do not have to be combined in the case where the ghost detector does not detect a short static ghost. Instead, the better of the two maps can be selected in order to separate the data in a data frame.

Furthermore, as described above, the transmitter of FIG. 14 does not change the current map or the next map in the fields of the frame whose frame count is 0 and, instead, makes the map change in frame k+1 whose frame count is reset to k (or other number). Thus, in frame k+1, the previous next map becomes the current map, and a new map is used as the next map. This map change, however, can be made in the frame following the frame whose frame count is 1 or any other frame. Thus, the frame count that triggers the map change is arbitrary.

Additionally, it is noted that four bits are used to specify the frame count, and that the value of k is thereby limited. However, the map change described above can be delayed by a number of frames greater than k. Indeed, the same current map and next map combination may be inserted into any number of frames greater than k by simply not decrementing k or not decrementing k completely until dk frames later, where d is any number greater than 1. Accordingly, any one or more values of k greater than 0 (or other switch number) can simply be repeated a desired number of times.

Also, in connection with at least the invention of FIGS. 14–17, encoders and decoders using coding and decoding techniques other than Kerdock encoding and decoding may be used in place of the Kerdock encoder 402 and the Kerdock decoder 43.

Additionally, as described above, interleaving and de-interleaving need not be employed in connection with the invention disclosed with respect to FIGS. 14–17. Nevertheless, interleaving and de-interleaving may be employed in connection with the invention disclosed with respect to FIGS. 14–17. Such interleaving and de-interleaving can provide additional protection against burst noise.

Moreover, as indicated above, a field may contain E-VSB data coded using different coding rates. In this case, the map must additionally designate the various coding rates that apply to the differently coded E-VSB data segments.

Furthermore, as indicated above with respect to FIGS. 18 and 19, an inverter in a transmitter inverts the 64 bit Kerdock code vector to be inserted into the even field and does not invert the 64 bit Kerdock code vector to be inserted into the odd field. Alternatively, the inverter in the transmitter could instead invert the 64 bit Kerdock code vector to be inserted into the odd field and not invert the 64 bit Kerdock code vector to be inserted into the even field. In this case, the inverter in the receiver inverts the received odd field 64 bit Kerdock code vector and does not invert the received even field 64 bit Kerdock code vector.

Also, the Kerdock code vectors that are combined by the combiner 502 may be transmitted and received in different fields of the same frame or in the fields of different frames. For example, the combiner 502 may be arranged to combine the even field 64 bit Kerdock code vector from one frame and the odd field 64 bit Kerdock code vector from an adjacent frame.

Moreover, the switches 478 and 496 have been shown in FIGS. 18 and 19 as mechanical switches for ease of understanding. However, it should be understood that these switches may be of any type such as electronic switches.

Furthermore, as described above, $mdu_o$ includes ten current map symbols and includes two frame count symbols, and $mdu_e$ includes ten next map symbols and includes the remaining two symbols of the four symbol frame count. As suggested above, however, these symbols comprise any number of signal levels. For example, the twelve symbols making up each of the maps may be transmitted using only two signal levels, in which case the symbols may be referred to as bits. However, the map symbols may be transmitted using other numbers of signal levels.

Additionally, as should be evident from the above description, each map contains ten map symbols and two count symbols. The map symbols are decoded in order to determine the mixes and locations of ¼ rate coded E-VSB segments, ½ rate coded E-VSB segments, and/or VSB segments in a field. One exemplary decoding technique requires the decoding of all of the map symbols of a map in order to determine the number of any one of the first E-VSB data segments, the second E-VSB data segments, or the VSB data segments.

Also, coding rates of ¼ and ½ have described in connection with FIGS. 20 and 21. However, E-VSB coding rates other than ¼ and ½ may be used in connection with the present invention.

Moreover, as described above, an algorithm is used to determine the segments containing E-VSB data. Instead, other mechanisms, such as a look up table, can be used to determine the locations of the E-VSB segments having the x and x+1 spacing described above.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method of receiving a field of transmitted data, wherein the field comprises E-VSB data segments containing E-VSB data and VSB data segments containing VSB data, the method comprising:

receiving the field containing a map that designates a data segment mix contained in the received field;

decoding the received map to determine the number of E-VSB data segments in the received field;

determining the locations of at least the E-VSB data segments in the received field according to the following expression:

$$s=Int(k*156/P) \text{ for } k=0 \text{ to } k=(2*P-1)$$

wherein P is the number of E-VSB data segments in the received field divided by two, wherein s designates segment number, wherein Int designates a rounding down operation, and wherein k varies from 0 to 2*P−1; and, separating at least one of the received E-VSB and VSB data segments according to the segment number s.

2. The method of claim 1 wherein the determining of the locations of at least the E-VSB data segments in the received field comprises implementing the following algorithm:

$$s=Int(k*156/P) \text{ for } k=0 \text{ to } k=(2*P-1).$$

3. The method of claim 1 wherein the determining of the locations of at least the E-VSB data segments in the received field comprises implementing the following algorithm:

$$m=156/P$$

$$s=Int(k*m), \text{ for } k=0, \ldots, (2*P-1).$$

4. The method of claim 1 wherein the E-VSB data segments comprise first and second E-VSB data segments, wherein the first and second E-VSB data segments contain data coded at two different E-VSB coding rates respectively, and wherein the separating of at least one of the received E-VSB and VSB data segments comprises separating at least one of the received first and second E-VSB data segments and the VSB data segments.

5. A method of transmitting a data field, wherein the field comprises E-VSB data segments and VSB data segments, wherein the E-VSB data segments contain E-VSB data, and wherein the VSB data segments contain VSB data, the method comprising:

generating a map for the field, wherein the map defines the number of the E-VSB data segments in the field;

inserting the map into the field;

inserting data into at least the E-VSB data segments of the field in accordance with segment numbers s, wherein s is determined according to the following expression:

$$s=Int(k*156/P) \text{ for } k=0 \text{ to } k=(2*P-1)$$

wherein P is the number of E-VSB segments in the corresponding field divided by two, wherein Int designates a rounding down operation, and wherein k varies from 0 to 2*P−1; and, transmitting the field.

6. The method of claim 5 wherein the inserting of data into at least the E-VSB data segments of the field comprises implementing the following algorithm:

$s=Int(k*156/P)$ for $k=0$ to $k=(2*P-1)$.

7. The method of claim 5 wherein the inserting of data into at least the E-VSB data segments of the field comprises implementing the following algorithm:

$m=156/P$ $s=Int(k*m)$, for $k=0, \ldots, (2*P-1)$.

8. The method of claim 5 wherein the E-VSB data segments comprise first and second E-VSB data segments, and wherein the first and second E-VSB data segments contain data coded at two different E-VSB coding rates respectively.

9. A method of receiving a transmitted data field, the field containing a number of E-VSB data segments and a number of VSB data segments, the method comprising:

receiving the field which contains a map that indicates at least the number of E-VSB data segments contained in the received field;

determining the locations of at least the E-VSB data segments in the received field based on a distribution of the E-VSB data segments in which the spacing between E-VSB segments comprises only x and x+1, wherein x is dependent on the number of E-VSB data segments in the field as indicated by the map; and, separating the received E-VSB data segments and the VSB data segments according to the determined locations.

10. The method of claim 9 wherein the determining of the locations of at least the E-VSB data segments in the received field comprises implementing the following algorithm:

$s=Int(k*156/P)$ for $k=0$ to $k=(2*P-1)$ wherein P is the number of E-VSB data segments in the received field divided by two, wherein s designates segment number, wherein Int designates a rounding down operation, and wherein k varies from 0 to 2*P−1.

11. The method of claim 9 wherein the determining of the locations of at least the E-VSB data segments in the received field comprises implementing the following algorithm:

$m=156/P$ $s=Int(k*m)$, for $k=0, \ldots, (2*P-1)$ wherein P is the number of E-VSB data segments in the received field divided by two, wherein s designates segment number, wherein Int designates a rounding down operation, and wherein k varies from 0 to 2*P−1.

12. The method of claim 9 wherein the E-VSB data segments comprise first and second E-VSB data segments, wherein the first and second E-VSB data segments contain data coded at two different E-VSB coding rates respectively, and wherein the separating of the received E-VSB and VSB data segments comprises separating at least one of the received first and second E-VSB data segments and the VSB data segments.

13. A method of transmitting a data field containing a number of E-VSB data segments and a number of VSB data segments, the method comprising:

generating a map for the field, wherein the map indicates at least the number of E-VSB data segments in the field;

inserting the map into the field;

inserting data into at least the E-VSB data segments of the field in accordance with segment numbers s, wherein the spacing between segment numbers s comprises only x and x+1, and wherein x is dependent on the number of E-VSB data segments in the field as indicated by the map; and, transmitting the field.

14. The method of claim 13 wherein the inserting of data into at least the E-VSB data segments of the field comprises implementing the following algorithm:

$s=Int(k*156/P)$ for $k=0$ to $k=(2*P-1)$ wherein P is the number of E-VSB data segments in the received field divided by two, wherein Int designates a rounding down operation, and wherein k varies from 0 to 2*P−1.

15. The method of claim 13 wherein the inserting of data into at least the E-VSB data segments of the field comprises implementing the following algorithm:

$m=156/P$ $s=Int(k*m)$, for $k=0, \ldots, (2*P-1)$ wherein P is the number of E-VSB data segments in the received field divided by two, wherein Int designates a rounding down operation, and wherein k varies from 0 to 2*P−1.

16. The method of claim 13 wherein the E-VSB data segments comprise first and second E-VSB data segments, and wherein the first and second E-VSB data segments contain data coded at two different E-VSB coding rates respectively.

* * * * *